US012783020B2

(12) United States Patent
Chianghsieh et al.

(10) Patent No.: US 12,783,020 B2
(45) Date of Patent: Nov. 3, 2026

(54) RISER CARD SUPPORTING BOTH INTERNAL AND PLUGGABLE STORAGE DRIVES

(71) Applicant: HEWLETT PACKARD ENTERPRISE DEVELOPMENT LP, Spring, TX (US)

(72) Inventors: Peng Chianghsieh, Taipei (TW); Chih-Wei Chiang, Taipei (TW); Chui Ching Chiu, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 239 days.

(21) Appl. No.: 18/888,425

(22) Filed: Sep. 18, 2024

(65) Prior Publication Data

US 2026/0079545 A1 Mar. 19, 2026

(51) Int. Cl.
*H05K 7/14* (2006.01)
*G06F 1/185* (2026.01)

(52) U.S. Cl.
CPC ........... *G06F 1/185* (2013.01); *H05K 7/1424* (2013.01); *H05K 7/1452* (2013.01)

(58) Field of Classification Search
CPC ...... H05K 7/14; H05K 7/1402; H05K 7/1404; H05K 7/1405; H05K 7/1408; H05K 7/1424; H05K 7/1425; H05K 7/1431; H05K 7/1452; H05K 7/1485; H05K 7/1487; H05K 7/1488; H05K 7/1489; H05K 7/1491;

(Continued)

(56) References Cited

U.S. PATENT DOCUMENTS 6,533,587 B1 * 3/2003 Potter ..................... G06F 1/184
7,075,797 B1 * 7/2006 Leonard .................. G06F 1/184 439/59
7,566,227 B2 * 7/2009 Li .......................... H01R 12/52 361/752
8,423,695 B2 * 4/2013 Purwin .................. H05K 1/117 710/301
10,176,143 B2 1/2019 Tamarkin et al.
10,243,287 B1 * 3/2019 Huang ............... H01R 12/7082

(Continued)

FOREIGN PATENT DOCUMENTS

CN 110716614 A 1/2020
EP 1684186 A1 7/2006

OTHER PUBLICATIONS

Shenzhen Huihuangxing Electronics Co., Ltd, "PCB KB-6150 FR4 94CO 2OZ 4Layer Imme Gold—Bevelling Gold Finger," Retrieved online May 31, 2024, Product, http://www.faiwong.net/en/pcb-kb-6150-fr4-94vo-2oz-4layer-imme-gold-bevelling-gold-finger.html.

*Primary Examiner* — Gage Crum
(74) *Attorney, Agent, or Firm* — Hewlett Packard Enterprise Patent Department

(57) ABSTRACT

A riser card includes a circuit board, first and second riser edge connectors, and first and second riser socket connectors that are configured to mate with first and second drive connectors respectively, of first and second storage drives. Each of the first and second riser edge connectors has a first form factor. Further, the first and second riser edge connectors are positioned at a first edge and a second edge respectively, of the circuit board. The first riser socket connector is mounted to a first face of the circuit board and electrically connected to the first riser edge connector. The second riser socket connector is mounted to a second face of the circuit board and electrically connected to the second riser edge connector. The first riser socket connector has a second form factor, and the second riser socket connector has a third form factor different from the second form factor.

20 Claims, 12 Drawing Sheets

(58) Field of Classification Search
CPC ...... H05K 5/0217; H05K 5/30; H05K 5/0286; H05K 5/0291; H05K 5/0221; H01R 12/7029; H01R 12/7023; H01R 12/7058; H01R 12/721; H01R 12/722; H01R 12/724; H01R 12/737; H01R 13/6275; H01R 13/639; H01R 4/50; H01R 43/26; H01R 13/629; G06F 1/16; G06F 1/18; G06F 1/181; G06F 1/183; G06F 1/185; G06F 1/186; G06F 1/187; G06F 15/16; G06F 15/161; G11B 33/126; G11B 33/128
USPC ......... 361/679.31, 679.02, 724, 679.37, 727, 361/679.33, 679.32, 728, 729, 730, 725
See application file for complete search history.

(56) References Cited

U.S. PATENT DOCUMENTS

| | | | | |
|---|---|---|---|---|
| 2006/0161717 | A1 | 7/2006 | Purwin | |
| 2007/0275577 | A1* | 11/2007 | Masumori | G06F 1/185 439/76.1 |
| 2009/0109609 | A1* | 4/2009 | Lai | G06F 1/187 361/679.39 |
| 2016/0170928 | A1* | 6/2016 | Tamarkin | G06F 1/16 710/313 |
| 2017/0010641 | A1* | 1/2017 | Moore | G06F 1/187 |
| 2017/0371383 | A1* | 12/2017 | Yang | F16B 21/02 |
| 2018/0138612 | A1* | 5/2018 | Lin | G06F 1/185 |
| 2021/0007236 | A1* | 1/2021 | Wu | G06F 1/187 |
| 2022/0057848 | A1* | 2/2022 | Chang | G06F 1/185 |
| 2024/0365497 | A1* | 10/2024 | Kidd | H05K 7/1487 |

* cited by examiner

RISER CARD SUPPORTING BOTH INTERNAL AND PLUGGABLE STORAGE DRIVES

BACKGROUND

An information processing device such as a computer, a networking device, or the like may include a primary system board (e.g., a motherboard or a host processor module) having essential hardware components such as central processor units, resistors, capacitors, or the like to provide some basic functions. In order to pursue stronger performance and/or expand functionality of the device, additional hardware components such as a storage drive, a transceiver, a display card may be coupled to the primary system board. In certain information processing devices, the primary system board may include a connector that can directly receive the additional hardware component(s). However, in other information processing devices, the primary system board may lack the appropriate number, arrangement, or type of connectors needed to receive such desired additional hardware component(s), or the connectors may be present but in an inconvenient location, and thus in certain information processing devices, another card (or intermediary card) which carries a connector that is suitable for the additional hardware components may be coupled to the primary system board, thus providing the needed connection point for the additional hardware components. Such an intermediary card is generally referred to as a riser card.

BRIEF DESCRIPTION OF THE DRAWINGS

Various examples will be described below with reference to the following figures.

DETAILED DESCRIPTION

Figure 1A:
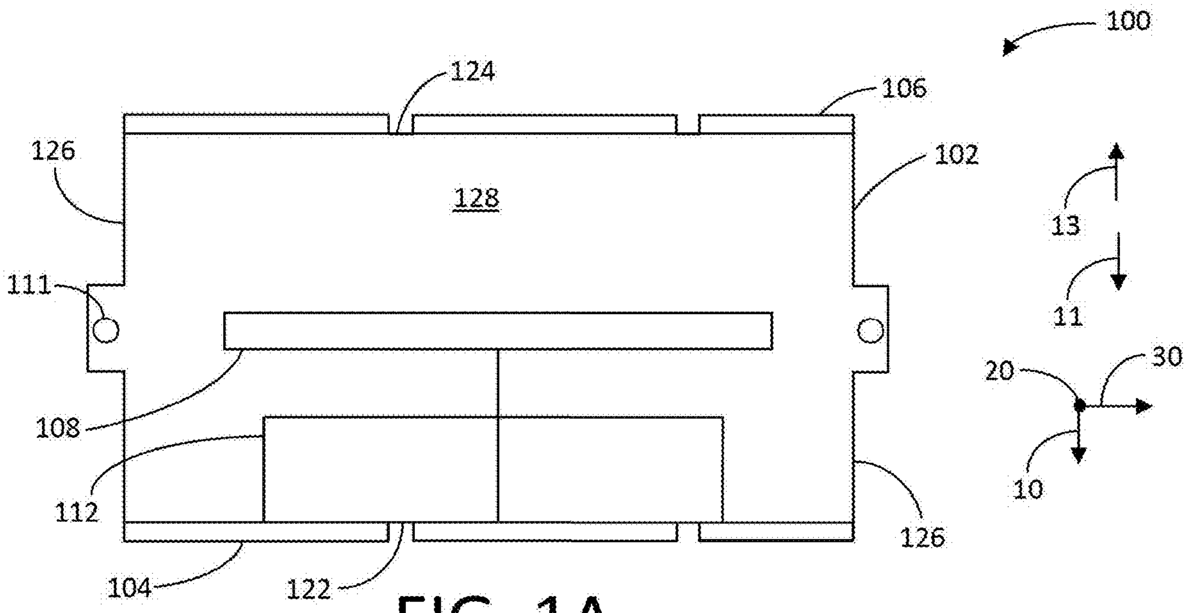
FIG. 1A includes a schematic side view of a riser card according to an example of the present disclosure.

The following detailed description refers to the accompanying drawings. For purposes of explanation, certain examples are described with reference to the components illustrated in FIGS. 1-9. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

A riser card is an electronic card including a circuit board and riser connectors (e.g., electrical connectors) having a riser edge connector positioned at an edge of the circuit board and a riser socket connector mounted to a face of the circuit board. The circuit board is configured to be coupled to a primary system board of an information processing device by detachably mating the riser edge connector to a system board connector of the primary system board to receive power signals, data signals, and sideband signals from the system board connector. Certain additional hardware components such as a storage drive, for example, is configured to be coupled to the primary system board by detachably mating a drive connector of the storage drive with a riser socket connector of the riser card such that the storage drive is electrically connected to the primary system board via the riser card.

The storage drives are generally available in multiple form factors, for example, an M.2 form factor or an enterprise and datacenter standard (EDS) form factor so as to meet storage requirements of various customers. In such cases, the drive connector of each storage drive may also have a form factor that corresponds to the form factor of a respective storage drive. For example, the drive connector of the storage drive having the M.2 form factor may have an M.2 plug connector form factor, and the drive connector of the storage drive having the EDS form factor may have an EDS plug connector form factor. Similarly, the riser socket connector of the riser card may also have a form factor that is compatible with the form factor of the drive connector of the storage drive. For example, the riser socket connector configured to support the storage drive having the M.2 form factor, may have an M.2 receptacle connector form factor, and the riser socket connector configured to support the storage drive having the EDS form factor, may have an EDS receptacle connector form factor. Thus, in such cases, the storage drive may be detachably mated with the riser card, only when the form factors of the riser socket connector and the drive connector are compatible with each other. Therefore, whenever the customers desire to switch from the storage drive having one form factor to a new storage drive having another form factor, the customer may additionally need to procure a new riser card having a riser socket connector that has a form factor compatible with a form factor of the drive connector of the new storage drive.

Furthermore, certain information processing devices may require storage drives of both form factors so as to improve performance and/or expand functionality of the information processing device. For example, the information processing device that has the storage drive having the M.2 plug connector pre-installed to the riser card having the M.2 receptacle connector may sometimes further require a new storage drive having the EDS plug connector to improve the performance and/or expand the functionality of the information processing device. In such cases, the riser card that is configured to only support the storage drive having the M.2 plug connector may lack a type of connector e.g., the EDS receptacle connector to support the new storage drive having the EDS plug connector. Therefore, whenever the customers desire to use the new storage drive having a different form factor along with the existing storage drive, a new riser card having a riser socket connector that has a form factor compatible with a form factor of the drive connector of such new storage drive may have to be installed in the primary system board.

However, due to space constraints in the chassis, it may be difficult to install any new additional riser card in the chassis to provide support to the new storage drive. Furthermore, the information processing device may require multiple types of riser cards, where each type of riser card has a riser socket connector that is compatible with the form factor of the corresponding drive connector. Therefore, when multiple types of riser cards are made available, customers may need to order different types of riser cards based on the form factor of the storage drive which suits their requirements, and this may be cumbersome and difficult to manage. In addition, multiple numbers of different types of riser cards may need to be produced, and this may result in additional SKUs being needed and different inventory to be maintained by the manufacturers, which can in turn increase costs. Furthermore, replacing the riser cards with a new type of riser cards may be cumbersome, time consuming, expensive, and depend on the availability of inventory of such new riser cards.

A technical solution to the aforementioned problems may include providing a riser card that can be configurable into multiple configurations, and each of the multiple configurations of the riser card may be compatible to support storage drives of multiple form factors or the storage drive of any one form factor. In particular, the riser card may include a first riser socket connector having one form factor mounted to a first face of a circuit board of the riser card and a second socket connector having another form factor different from the form factor of the first riser socker connector, mounted to a second face opposite the first face of the circuit board. In such examples, when the circuit board of the riser card is installed in a primary system board of an information processing device, the first riser socket connector may be disposed facing an internal drive mounting area of the information processing device and configured to mate with a first drive connector of a first storage drive and the second riser socket connector may be disposed facing a drive cage coupled to a chassis of the information processing device and configured to detachably mate with a second drive connector of a second storage drive.

In some examples, the riser card includes a first riser edge connector positioned at a first edge of the circuit board, a second riser edge connector positioned at a second edge opposite to the first edge of the circuit board. In such examples, the first riser socket connector may be electrically connected to the first riser edge connector and the second riser socket connector may be electrically connected to the second riser edge connector. Further, each of the first and second riser edge connectors may have a same form factor, thereby allowing the circuit board to be interchangeably connected to a same primary system board connector of the primary system board in one of a first mounting orientation or a second mounting orientation of the riser card. The first mounting orientation is associated with the first face of the circuit board facing along the internal drive mounting area and the second face of the circuit board facing the drive cage, and the second mounting orientation is associated with the first face of the circuit board facing along the drive cage and the second face of the circuit card facing along the internal drive storage area, along with the circuit board being perpendicular to the primary system board. In the first mounting orientation, a first storage drive may be installed in the internal drive mounting area such that a first drive connector of the first storage drive mates with the first socket connector of the riser card, and a second storage drive may be removably installed in the drive cage such that a second drive connector of the second storage drive detachably mates with the second socket connector of the riser card. Similarly, in the second mounting orientation, the second storage drive may be installed in the internal drive mounting area such that the second drive connector mates with the second socket connector, and the first storage drive may be removably installed in the drive cage such that the first drive connector detachably mates with the first socket connector. In one or more examples, each of the first and second storage drives has different form factors and each of the first and second riser socket connectors also has different form factors. Further, each of the first and second riser edge connectors has power, sideband, and communication pins, and equal number and arrangement of the power, sideband, and communication pins.

Further, the riser card may have an array of first riser socket connectors mounted to the first face of the circuit board. In such examples, the riser card may support an array of first storage drives. Similarly, the riser card may have an array of second riser socket connectors mounted to the second face of the circuit board. In such examples, the riser card may additionally support an array of second storage drives.

In some examples, the information processing device may include a riser card mounting bracket attached to the primary system board and/or a base of the chassis. The riser card mounting bracket may be coupled to the riser card so as to support and secure the riser card in the system board connector. Additionally, the information processing device may include a drive mounting assembly having a bracket attached to the primary system board and/or the base and an M.2 mount attached to the bracket. The drive mounting assembly may support the first storage drive and/or the second storage drive on condition of the first storage drive or the second storage drive been installed in the internal drive mounting area.

Since a new riser card may be easily transitioned into multiple configurations to either support storage drives of multiple form factors, or the storage drive of any one form factor, the new riser card provides flexibility, serviceability, and benefit from supply chain in terms of reducing number of ready-made riser card needed in the inventory. Further, the new riser card is inexpensive to assemble, maintain, and replace, since a first riser socket connector and/or a second riser socket connector may have to be easily added to or removed from a respective face of a circuit board to assemble the new riser card.

In the description hereinafter, example riser cards and/or information processing devices are described with the help of several views oriented per a first axis 10 extending along a vertical direction, a second axis 20 extending along a horizontal direction, and a third axis 30 extending along a lateral direction, which are marked in the respective Figures. Further, the vertical, axial, and lateral directions may be perpendicular to each other and the measurements along the vertical, axial, and lateral directions may be referred to as a height, a width, and a length, respectively.

Figure 1B:
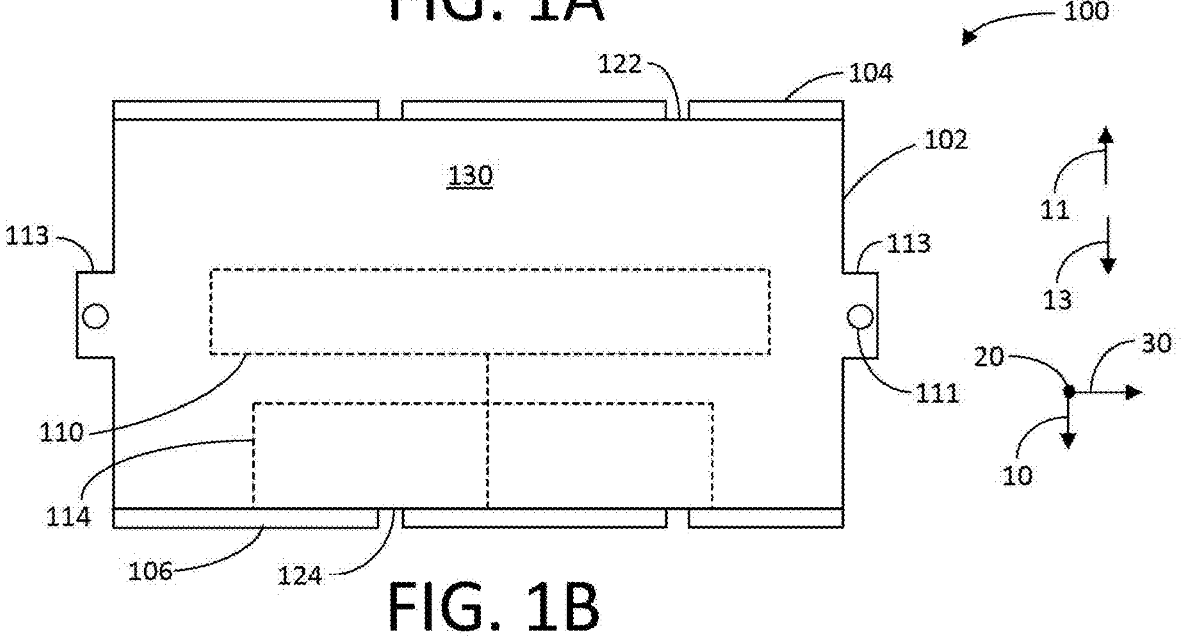
FIG. 1B includes another schematic side view of the riser card of FIG. 1A according to an example of the present disclosure.
Figure 1C:
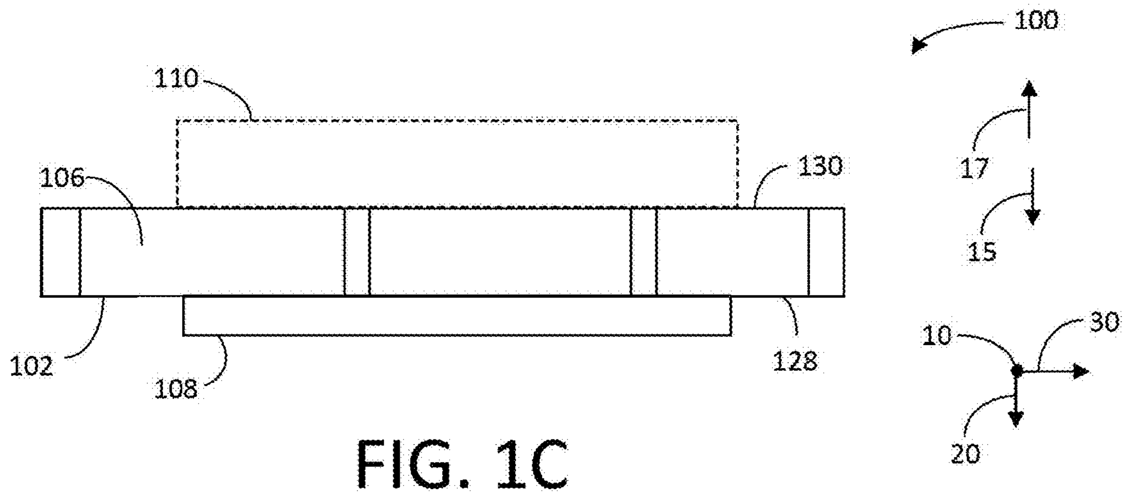
FIG. 1C includes a schematic top view of the riser card of FIGS. 1A-1B according to an example of the present disclosure.

Referring to the Figures, FIG. 1A depicts a schematic side view of a riser card 100; FIG. 1B depicts another schematic side view of the riser card 100 of FIG. 1A; and FIG. 1C depicts a schematic top view of the riser card 100 of FIG. 1A. It should be understood that FIGS. 1A-1C are not intended to illustrate specific shapes, dimensions, or other structural details accurately or to scale, and that implementations of the riser card 100 may have different numbers and arrangements of the illustrated components and may also include other parts that are not illustrated. Furthermore, Figures, FIGS. 1A-1C are described concurrently for ease of illustration.

The riser card 100 is an electronic card that may be installed in a primary system board of an information processing device so as to enable the information processing device to receive additional hardware components such as storage drives. The riser card 100 includes a circuit board 102, a plurality of electrical connectors, e.g., a first riser edge connector 104, a second riser edge connector 106, a first riser socket connector 108, a second riser socket connector 110, and a pair of mounting holes 111.

The circuit board 102 may be a printed circuit board having internal circuitry 112, 114 therein. The circuit board 102 has a first edge 122 (e.g., bottom edge), a second edge 124 (e.g., a top edge), a pair of peripheral edges 126 connected to the first and second edges 122, 124, respectively, a first face 128, and a second face 130 opposite to the first face 128. In some examples, the pair of mounting holes 111 is disposed on protruded portions 113 extending from the pair of peripheral edges 126 of the circuit board 102. In such examples, the riser card 100 may be coupled to a riser card mounting bracket (not shown) of the information processing device by extending fasteners (not shown) into the pair of mounting holes 111 in the riser card 100 and a plurality of mounting openings (not shown) in the riser card mounting bracket.

The first riser edge connector 104 may be a golden finger edge connector positioned at the first edge 122 of the circuit board 102. The first riser edge connector 104 is oriented parallel to the circuit board 102 and extends vertically from the first edge 122 of the circuit board 102 along a first vertical direction 11 which is parallel to a first axis 10 in the state shown in FIGS. 1A-1B. In some examples, the first riser edge connector 104 may have a first form factor such as a modular extensible input output (M-XIO) form factor. Hence, the first riser edge connector 104 may be referred to as an M-XIO plug connector. In some examples, the first riser edge connector 104 may be configured to directly mate with a first system board connector of the primary system board. In some other examples, the first riser edge connector 104 may be configured to mate with a first cable connector of a cable (not shown) having a second cable connector connected to a second system board connector of the primary system board. In such examples, each of the first system board connector, the second system board connector, the first cable connector, and the second cable connector may have the M-XIO form factor. Hence, each of the first system board connector, the second system board connector, and the first cable connector may be referred to as an M-XIO receptacle connector, and the second cable connector may be referred to as an M-XIO plug connector.

The second riser edge connector 106 may be another golden finger edge connector positioned at the second edge 124 opposite to the first edge 122 of the circuit board 102. The second riser edge connector 106 is oriented parallel to the circuit board 102 and extends vertically from the second edge 124 of the circuit board 102 along a second vertical direction 13 which is parallel to the first axis 10 in the state shown in FIGS. 1A-1B. In some examples, the second riser edge connector 106 may also have the first form factor such as the M-XIO form factor. Hence, the second riser edge connector 106 may be referred to as the M-XIO plug connector. In some examples, the second riser edge connector 106 may be configured to directly mate with the first cable connector of the cable having the second cable connector connected to the second system board connector of the primary system board. In some other examples, the second riser edge connector 106 may be configured to directly mate with the first system board connector of the primary system board. In such examples, each of the first system board connector, the second system board connector, the first cable connector, and the second cable connector may have the M-XIO form factor. Hence, each of the first system board connector, the second system board connector, and the first cable connector may be referred to as an M-XIO receptacle connector, and the second cable connector may be referred to as an M-XIO plug connector.

It may be noted that the M-XIO form factor of each of the first riser edge connector 104, the second riser edge connector 106, the first system board connector, the second system board connector, the first cable connector, and the second cable connector may be a standardized form factor defined as per the guidelines of an open compute program (OCP program). Further, the first riser edge connector 104 and the second riser edge connector 106 may both have power, sideband, and communication pins, and equal number and arrangement of the power, sideband, and communication pins. Accordingly, the first riser edge connector 104 and the second riser edge connector 106 may both be used to transfer the power, sideband, and data signals from the primary system board.

The first riser socket connector 108 may be a socket connector mounted to the first face 128 of the circuit board 102. The first riser socket connector 108 is oriented perpendicular to the circuit board 102 and extends horizontally from the first face 128 of the circuit board 102 along a first horizontal direction 15 which is parallel to a second axis 20 in the state shown in FIG. 1C. The first riser socket connector 108 may have a second form factor such as an M.2. form factor. Hence, the first riser socket connector 108 may be referred to as an M.2 receptacle connector. In some examples, the first riser socket connector 108 may be configured to mate with a first drive connector of a first storage drive having a form factor that is compatible to the second form factor of the first riser socket connector 108. In such examples, the first storage drive may have an M.2 form factor. Hence, the first drive connector of the first storage drive may have an M.2. plug connector. In one or more examples, the first riser socket connector 108 is electrically connected to the first riser edge connector 104 via the internal circuitry 112 of the riser card 100. Accordingly, the first riser socket connector 108 may be configured to receive the power, sideband, and data signals from the primary system board via the first riser edge connector 104, and the first riser socket connector 108 may be further configured to transfer such received power, sideband, and data signals to the first storage drive.

The second riser socket connector 110 may be another socket connector mounted to the first face 128 of the circuit board 102. The second riser socket connector 110 is oriented perpendicular to the circuit board 102 and extends horizontally from the second face 130 of the circuit board 102 along a second horizontal direction 17 opposite to the first horizontal direction 15 and which is parallel to the second axis 20 in the state shown in FIG. 1C. The second riser socket connector 110 may have a third form factor such as an enterprise and datacenter standard (EDS). form factor. Hence, the second riser socket connector 110 may be referred to as an EDSFF receptacle connector. In some examples, the second riser socket connector 110 may be configured to mate with a second drive connector of a second storage drive having a form factor that is compatible to the third form factor of the second riser socket connector 110. In such examples, the second storage drive may have an EDS form factor. Hence, the second drive connector of the second storage drive may be referred to as an EDS plug connector. In one or more examples, the second riser socket connector 110 is electrically connected to the second riser edge connector 106 via the internal circuitry 114 of the riser card 100. Accordingly, the second riser socket connector 110 may be configured to receive the power, sideband, and data signals from the primary system board via the second riser edge connector 106, and the second riser socket connector 110 may be further configured to transfer such received power, sideband, and data signals to the second storage drive.

In one or more examples, the second form factor is different from the third form factor. For example, as discussed herein, the second form factor may be the M.2 form factor, and the third form factor may be the EDS form factor. In such examples, the second form factor includes an M.2 receptacle connector form factor, and the third form factor includes an EDS receptacle connector form factor.

Figure 2A:
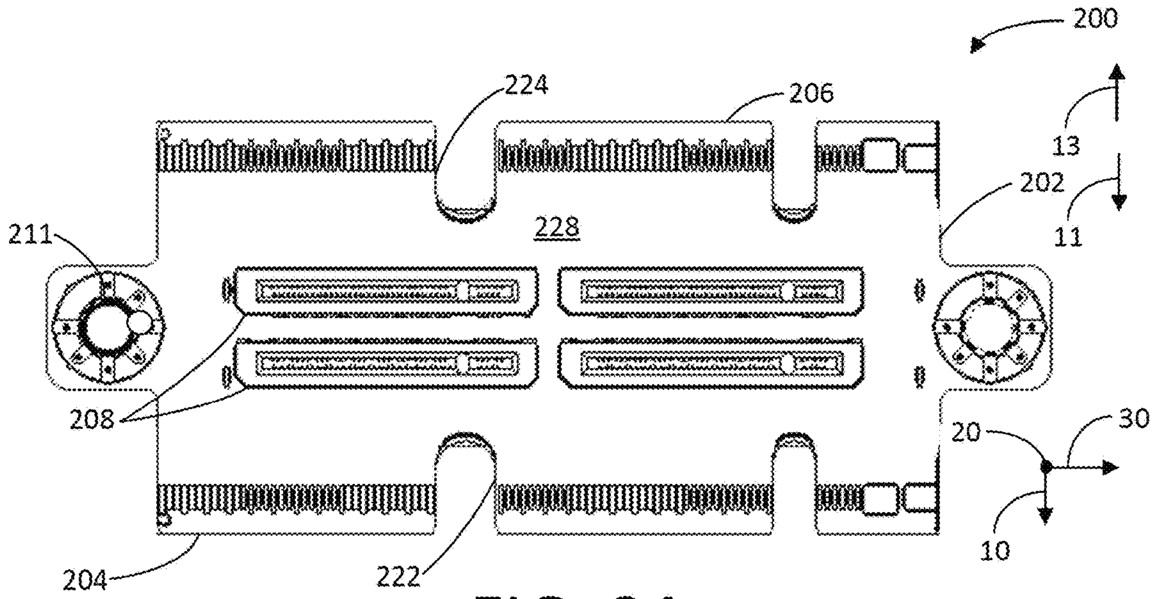
FIG. 2A includes a perspective side view of a riser card according to an example of the present disclosure.
Figure 2B:
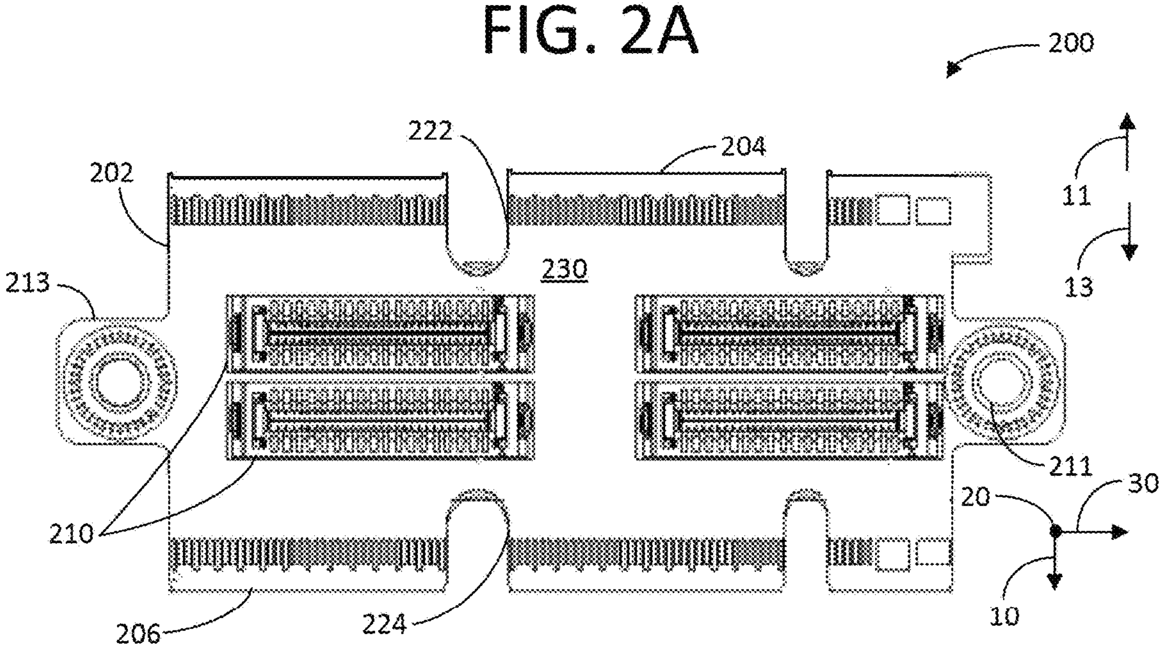
FIG. 2B includes another perspective side view of the riser card of FIG. 2A according to an example of the present disclosure.
Figure 2C:
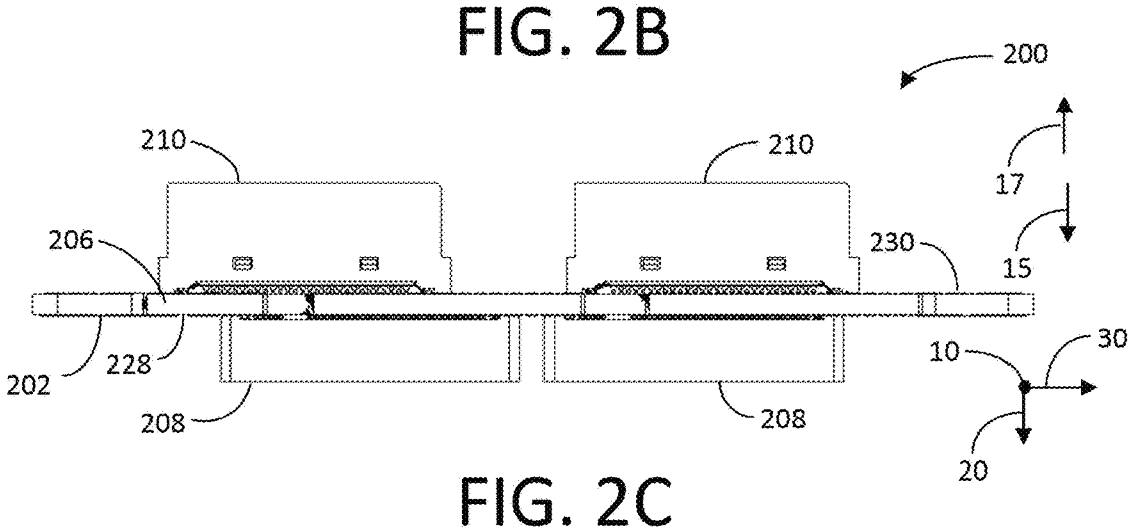
FIG. 2C includes a perspective top view of the riser card of FIG. 2A-2B according to an example of the present disclosure.

FIG. 2A depicts a perspective side view of a riser card 200; FIG. 2B depicts another perspective side view of the riser card 200 of FIG. 2A; and FIG. 2C depicts a perspective top view of the riser card 200 of FIG. 2A. Figures, FIGS. 2A-2C are described concurrently for ease of illustration. The riser card 200 includes a circuit board 202, a plurality of electrical connectors, e.g., a first riser edge connector 204, a second riser edge connector 206, an array of first riser socket connectors 208, an array of second riser socket connectors 210, and a pair of mounting holes 211.

The circuit board 202 has a first edge 222, a second edge 224, a pair of peripheral edges (not labeled) connected to the first and second edges 222, 224, respectively, a first face 228, and a second face 230 opposite to the first face 228. The pair of mounting holes 211 is formed on protruded portions 213 extending from the pair of peripheral edges of the circuit board 202.

The first riser edge connector 204 is positioned at the first edge 222 and extends vertically from the first edge 222 of the circuit board 202 along a first vertical direction 11 which is parallel to a first axis 10 in the state shown in FIGS. 2A-2B. In some examples, the first riser edge connector 204 has a first form factor such as a modular extensible input output (M-XIO) form factor. Hence, the first riser edge connector 204 may be referred to as an M-XIO plug connector. The second riser edge connector 206 is positioned at the second edge 224 and extends vertically from the second edge 224 of the circuit board 202 along a second vertical direction 13 which is parallel to the first axis 10. In some examples, the second riser edge connector 206 also has the first form factor such as the M-XIO form factor. Hence, the second riser edge connector 206 may be referred to as another M-XIO plug connector. The first riser edge connector 204 and the second riser edge connector 206 may both have power, sideband, and communication pins, and equal number and arrangement of the power, sideband, and communication pins. Further, the first riser edge connector 204 and the second riser edge connector 206 may both be used to transfer power, sideband, and data signals from a primary system board 762 (as shown in FIGS. 7A-7E).

Each first riser socket connector of the array of first riser socket connectors 208 is mounted to the first face 228 of the circuit board 202 and extends horizontally from the first face 228 along a first horizontal direction 15 which is parallel to a second axis 20 in the state shown in FIG. 1C. In the example of FIGS. 2A-2C, the riser card 200 has four first riser socket connectors 208 which are arranged in a 2×2 matrix format. Each first riser socket connector 208 has a second form factor such as an M.2. form factor. Hence, the first riser socket connector 208 may be referred to as an M.2 receptacle connector. Similarly, each second riser socket connector of the array of second riser socket connectors 210 is mounted to the second face 230 of the circuit board 202 and extends horizontally from the second face 230 along a second horizontal direction 17 opposite to the first horizontal direction 15 and which is parallel to the second axis 20 in the state shown in FIG. 1C. In the example of FIGS. 2A-2C, the riser card 200 has four second riser socket connectors 210 which are arranged in a 2×2 matrix format. Each first riser socket connector 208 has a third form factor such as an EDS form factor. Hence, the second riser socket connector 210 may be referred to as an EDS form factor receptacle connector. In the example of FIGS. 2A-2C, the riser card 200 is configured or customized by mounting both of the array of first riser socket connectors 208 and the array of second riser socket connectors 210 on the circuit board 202. As discussed hereinabove, each first riser socket connector 208 is electrically connected to the first riser edge connector 204 via internal circuitries (not shown) of the riser card 200. Similarly, each second riser socket connector 210 is electrically connected to the second riser edge connector 106 via other internal circuitries (not shown) of the riser card 200. Accordingly, each of the first riser socket connector 208 and the second riser socket connector 210 may be configured to receive the power, sideband, and data signals from the primary system board 762 via the first riser edge connector 204 and the second riser edge connector 206, respectively.

Figure 5:
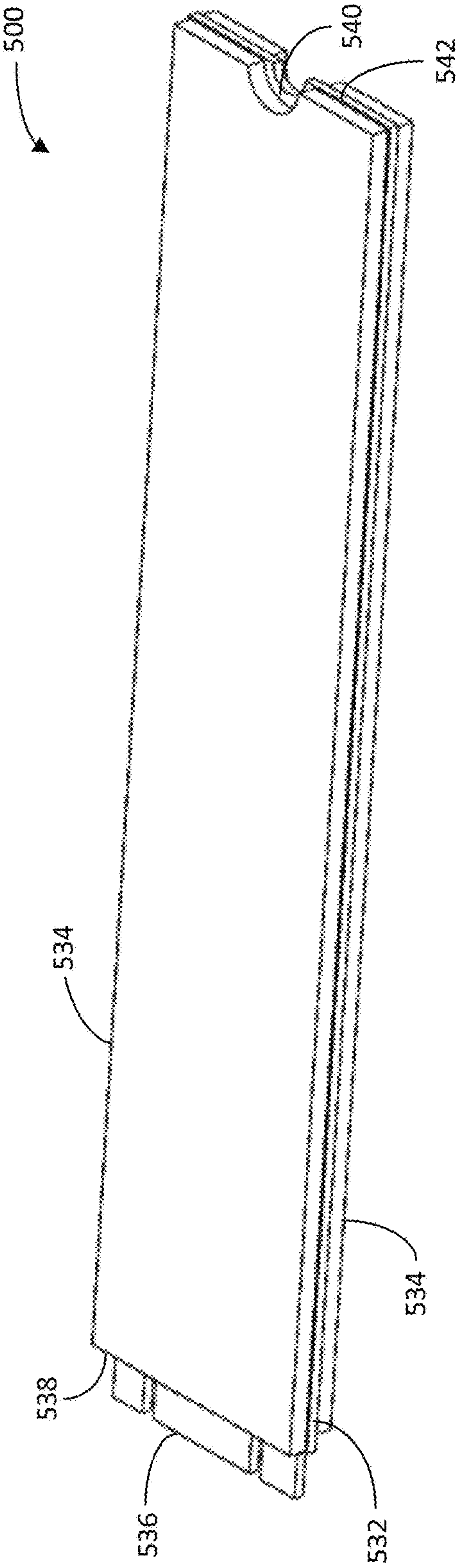
FIG. 5 includes a perspective view of a first storage drive according to an example of the present disclosure.
Figure 7A:
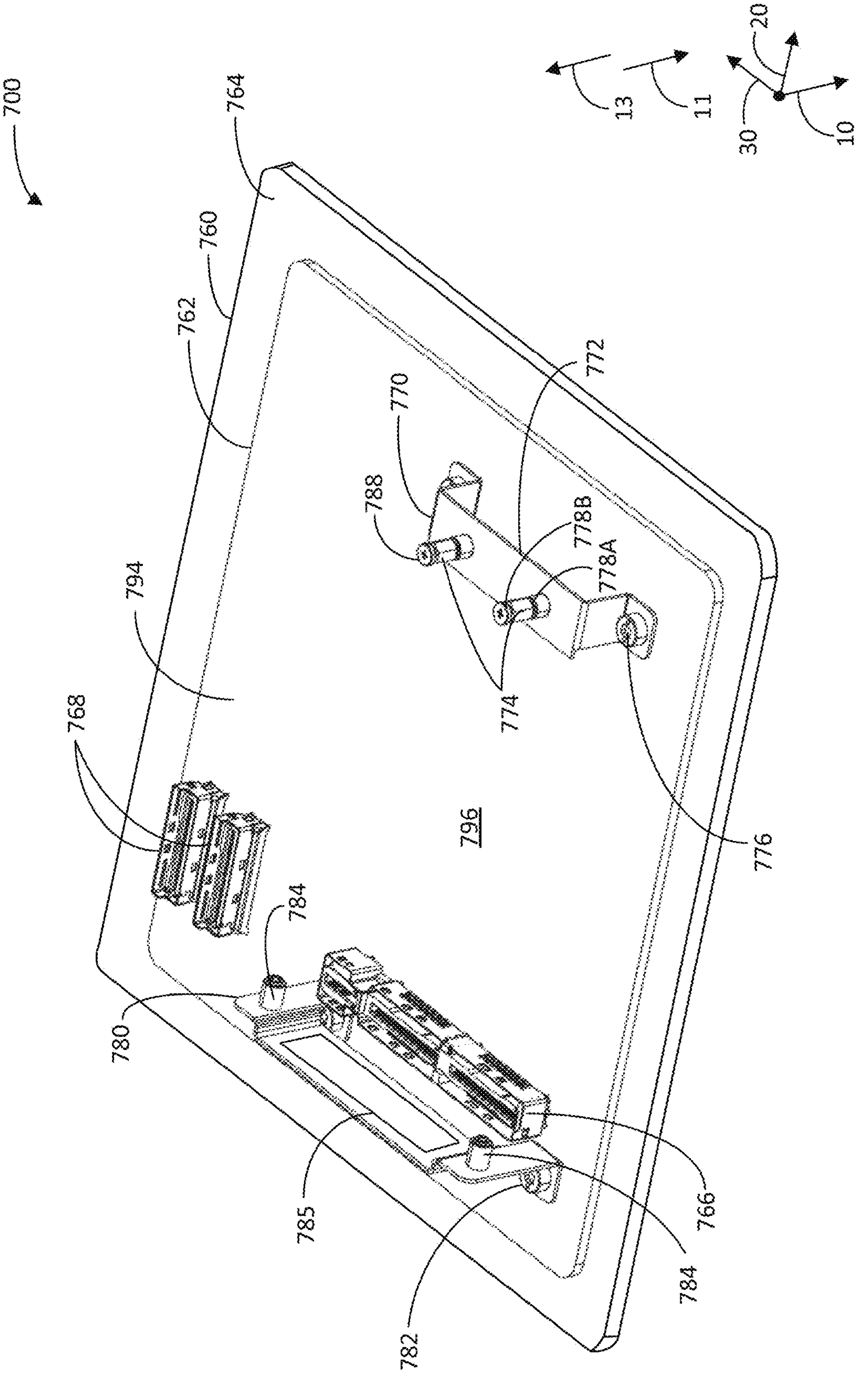
FIG. 7A includes a perspective view of a portion of an information processing device including a chassis and a primary system board according to an example of the present disclosure.

In some examples, the riser card 200 may be installed in the primary system board 762 in a first mounting orientation (as shown in FIGS. 7B-7E) in which: the first face 228 may face an internal drive mounting area 796 of the information processing device 700, and the second face 230 may face a drive cage 798 of the information processing device 700, the first riser edge connector 204 may be mated with a first system board connector 766 (as shown in FIG. 7A), of the primary system board 762, and the second riser edge connector 206 may be mated with a second system board connector 768 of the primary system board 762 via a cable 750. In such examples, each first riser socket connector 208 may be configured to mate with a first drive connector 536 (as shown in FIG. 5) of a corresponding first storage drive 500 (as shown in FIG. 5) among an array of first storage drive, having a complementary second form factor that is compatible to the second form factor of the first riser socket connector 208. Each first riser socket connector 208 may be configured to transfer the received power, sideband, and data signals from the primary system board 762 to a corresponding first storage drive 500.

Figure 6:
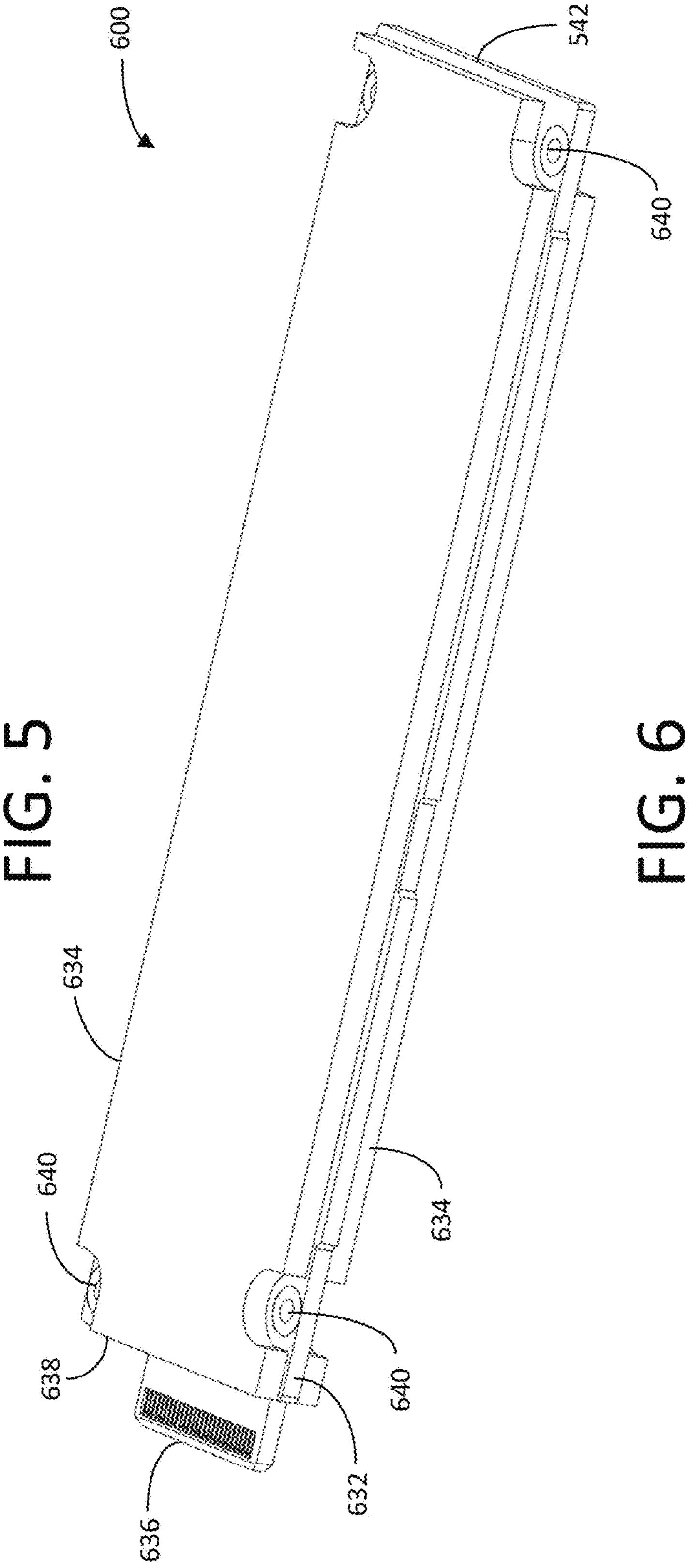
FIG. 6 includes a perspective view of a second storage drive according to an example of the present disclosure.
Figure 7B:
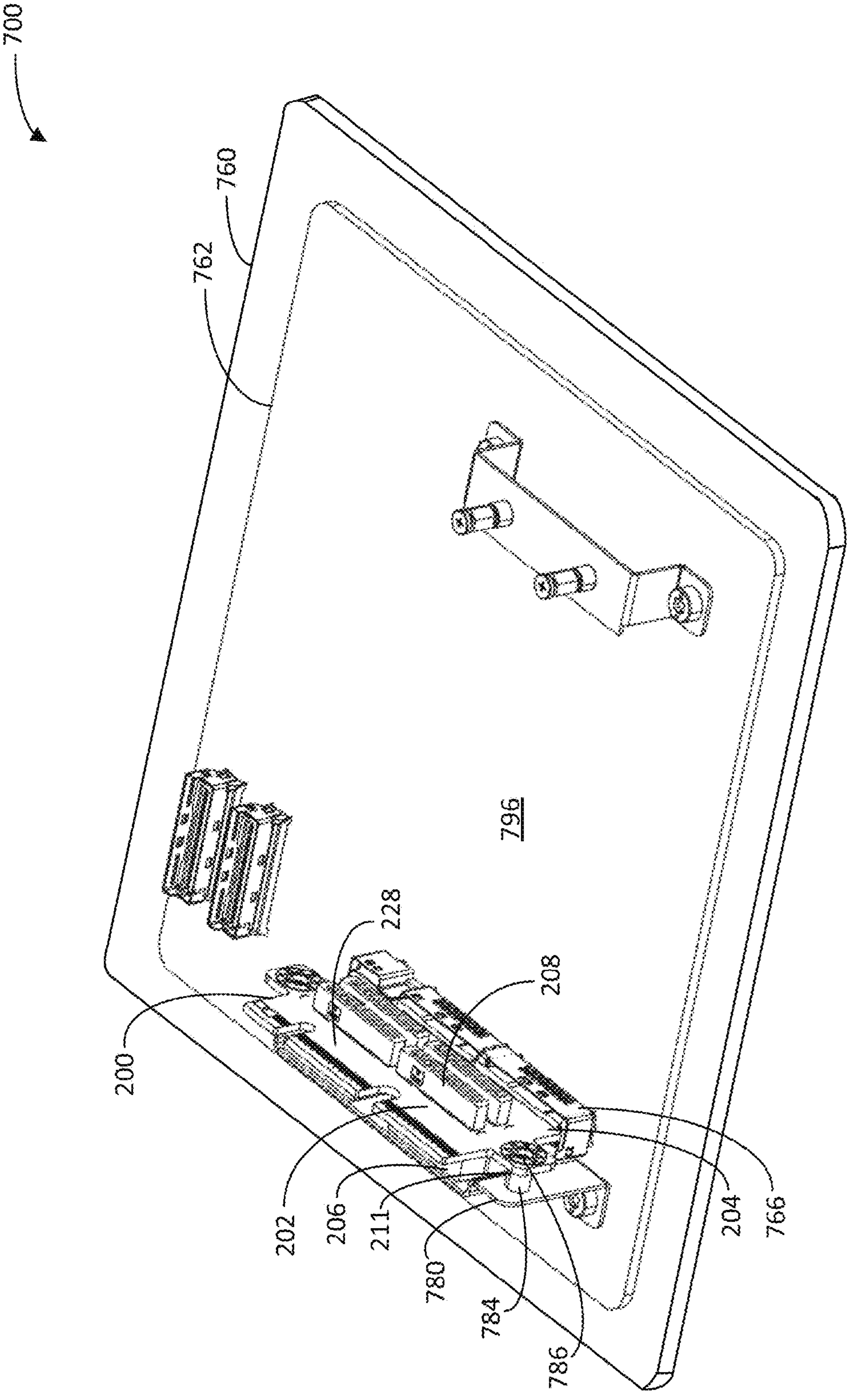
FIG. 7B includes a perspective view of the portion of the information processing device of FIG. 7A further having the riser card of FIGS. 2A-2C disposed in a first mounting orientation according to an example of the present disclosure.
Figure 7C:
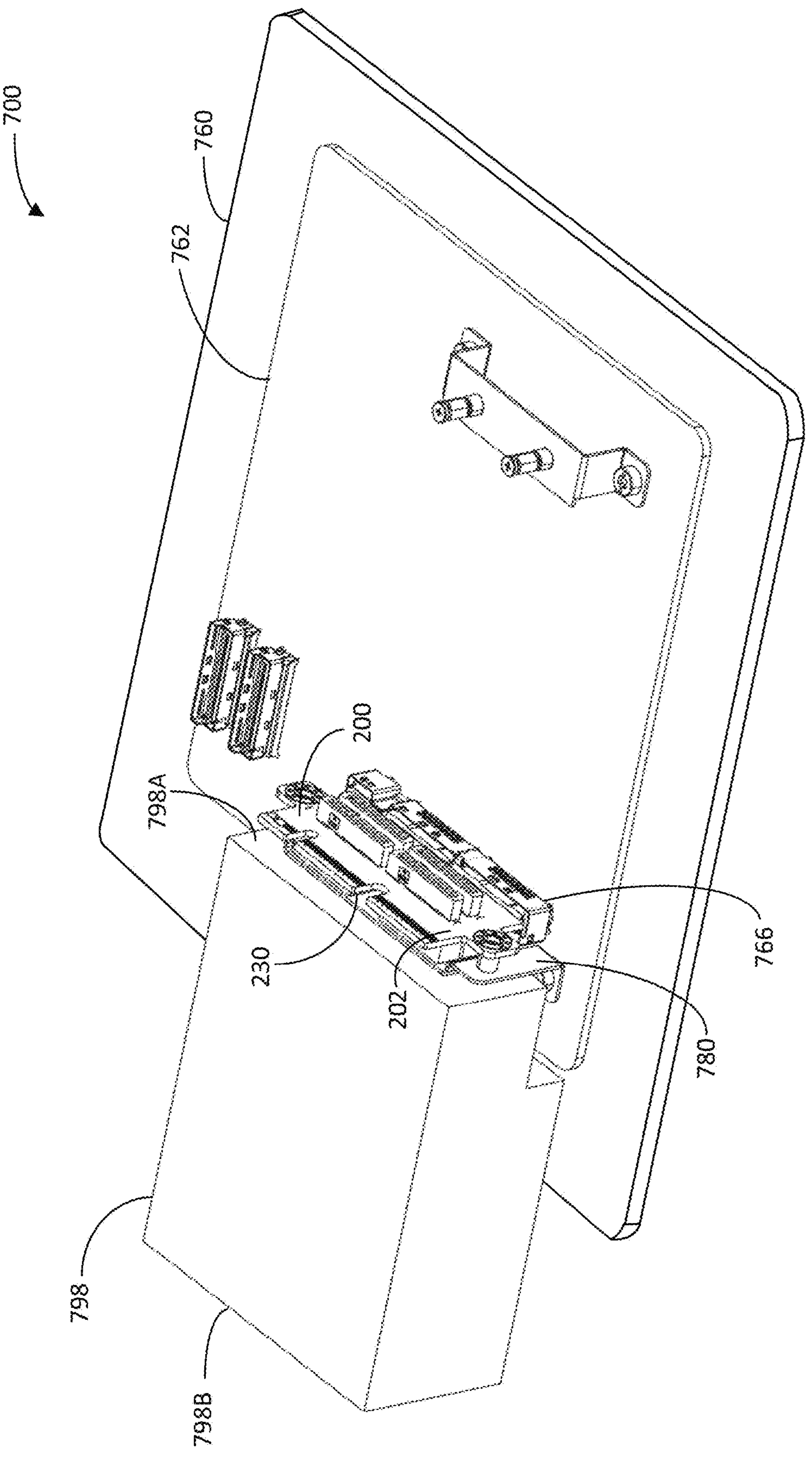
FIG. 7C includes a perspective view of the portion of the information processing device of FIG. 7B further including a drive cage according to an example of the present disclosure.
Figure 7D:
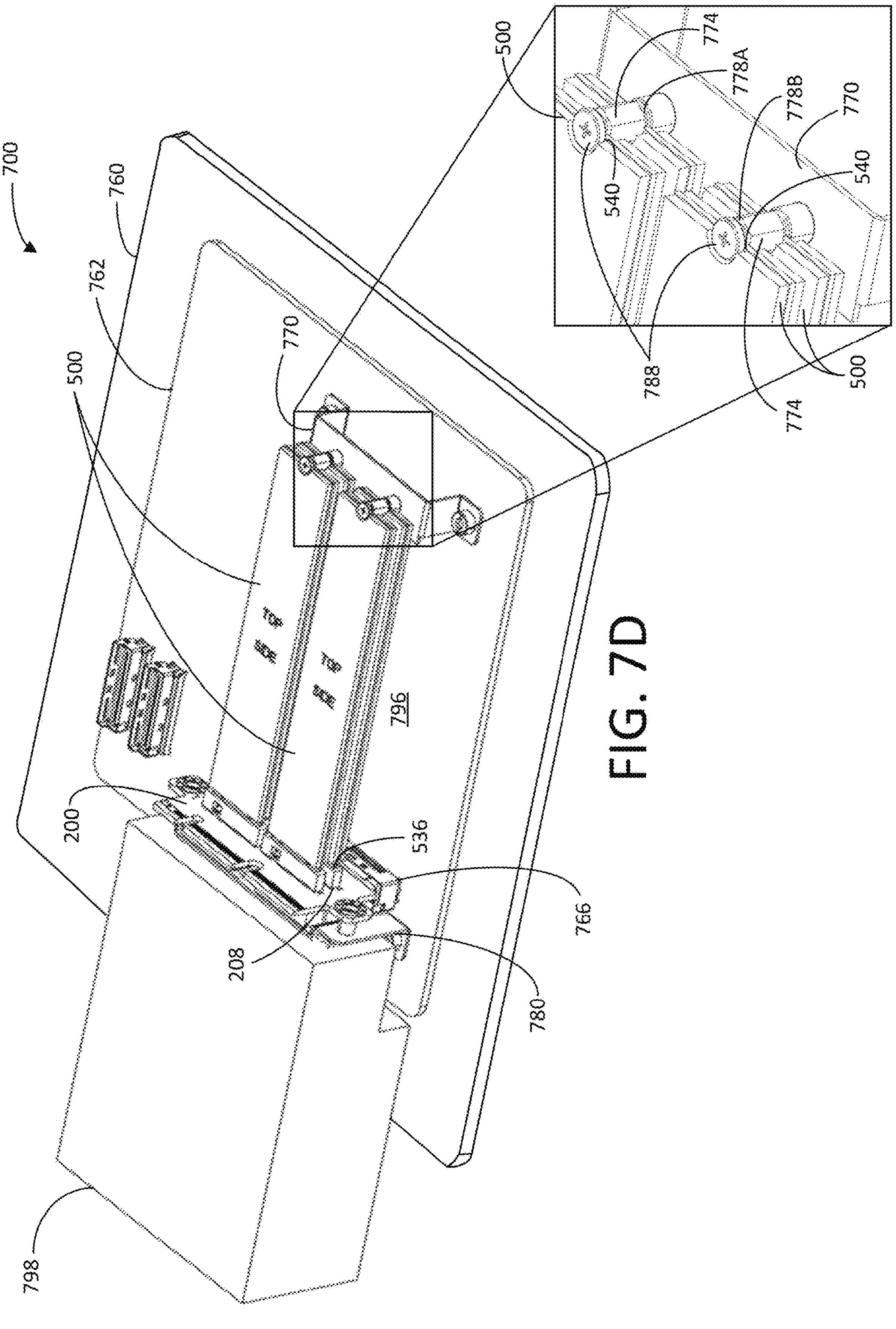
FIG. 7D includes a perspective view of the portion of the information processing device of FIG. 7C further having an array of first storage drives of FIG. 5 disposed in an internal drive mounting area of the information processing device and mated with the riser card according to an example of the present disclosure.
Figure 7E:
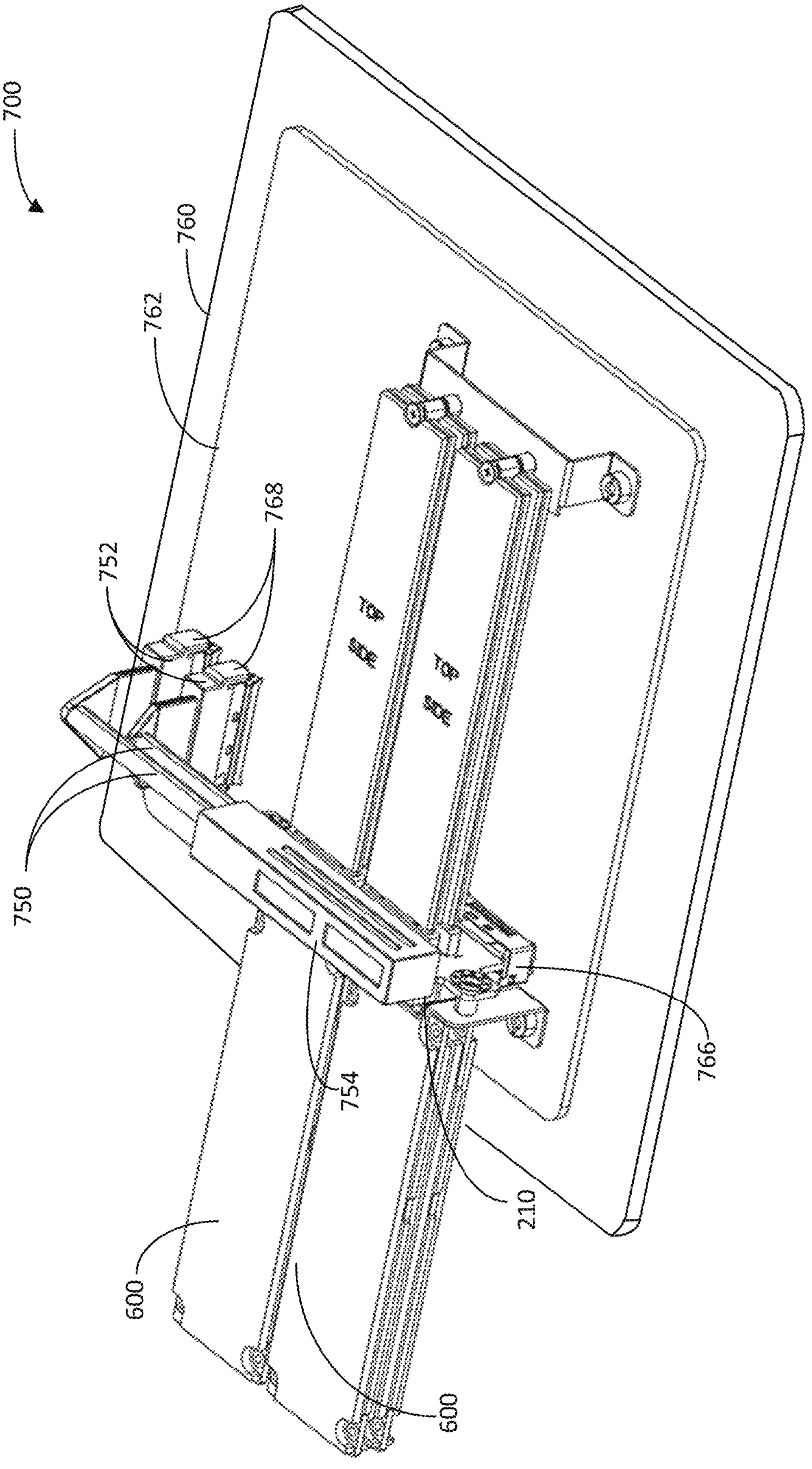
FIG. 7E includes a perspective view of the portion of the information processing device of FIG. 7D further having an array of second storage drives of FIG. 6 disposed in a drive cage of the information processing device and mated with the riser card according to an example of the present disclosure.
Figure 8:
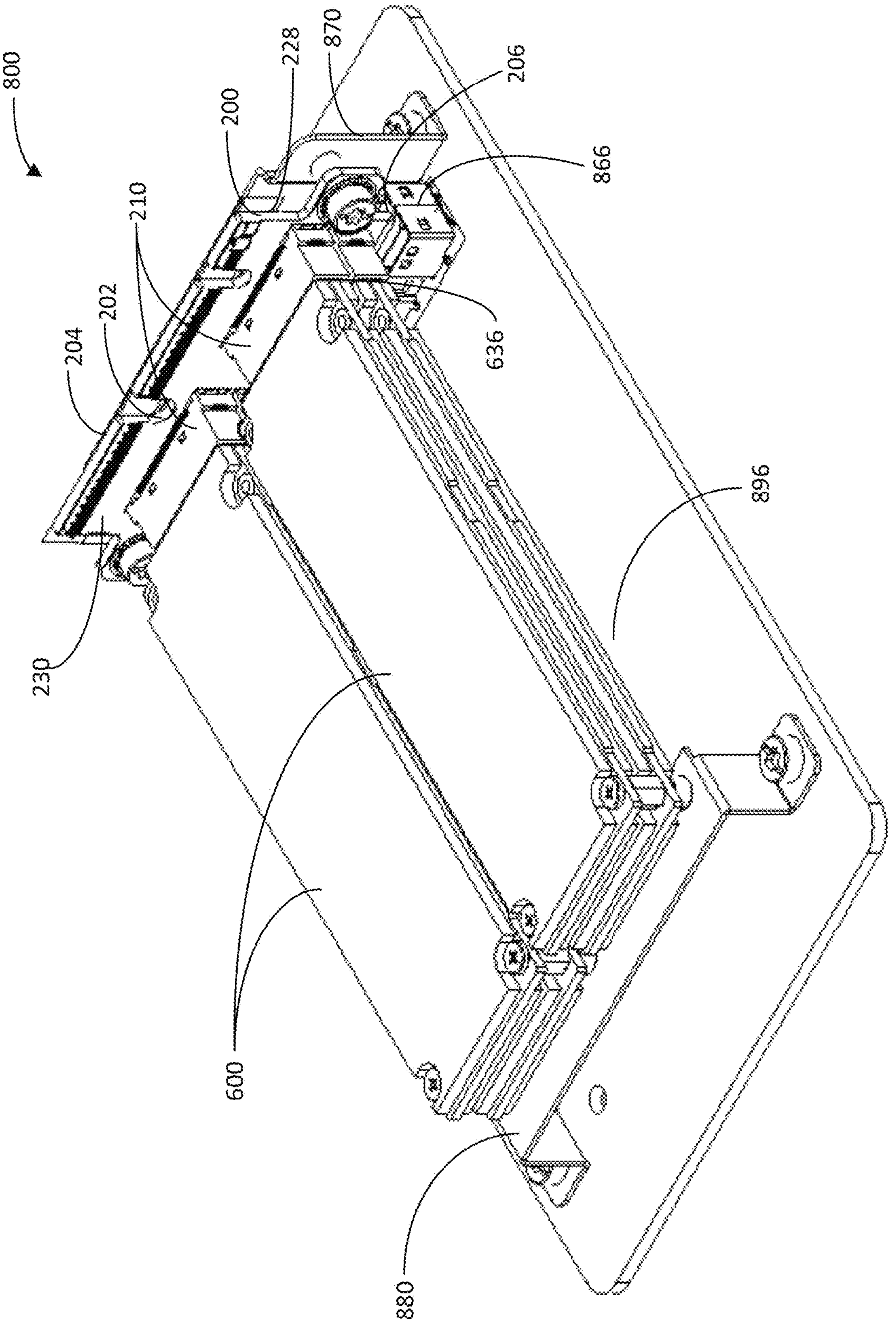
FIG. 8 includes a perspective view of a portion of an information processing device having a riser card disposed in a second mounting orientation and an array of second storage drives of FIG. 6 disposed in an internal drive mounting area of the information processing device and mated with the riser card according to an example of the present disclosure.

In some other examples, the riser card 200 may be flipped upside down relative to a third axis 30 to shift the riser card 200 from the first mounting orientation (as shown in FIGS. 7B-7E) to a second mounting orientation (as shown in FIG. 8). Further, the riser card 200 may be installed in the primary system board 762 in the second mounting orientation in which: the first face 228 may face the drive cage 798, and the second face 230 may face the internal drive mounting area 796, a second riser edge connector 206 may be mated with the first system board connector 766 of the primary system board 762, and the first riser edge connector may be mated with the second system board connector 768 of the primary system board 762 via the cable 750. In such examples, each second riser socket connector 210 may be configured to mate with a second drive connector 636 (as shown in FIG. 6) of a corresponding second storage drive 600 (as shown in FIG. 5) among an array of second storage drive, having a complementary third form factor that is compatible to the third form factor of the second riser socket connector 210. Each second riser socket connector 210 may be configured to transfer the received power, sideband, and data signals from the primary system board 762 to a corresponding second storage drive 600.

Figure 3A:
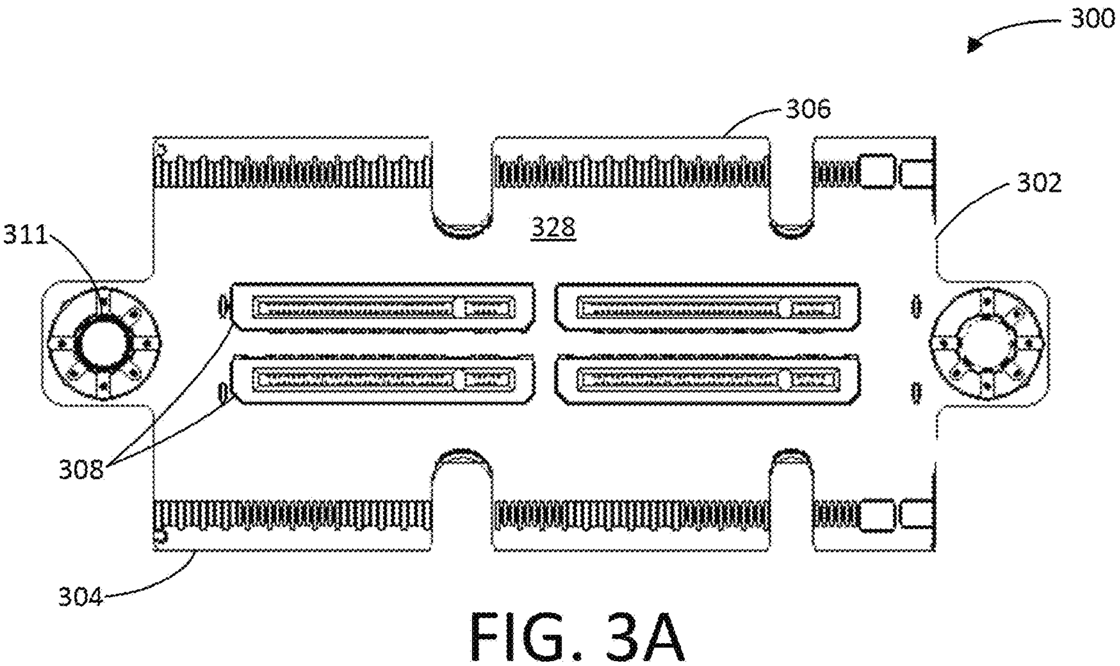
FIG. 3A includes a perspective side view of another riser card according to an example of the present disclosure.
Figure 3B:
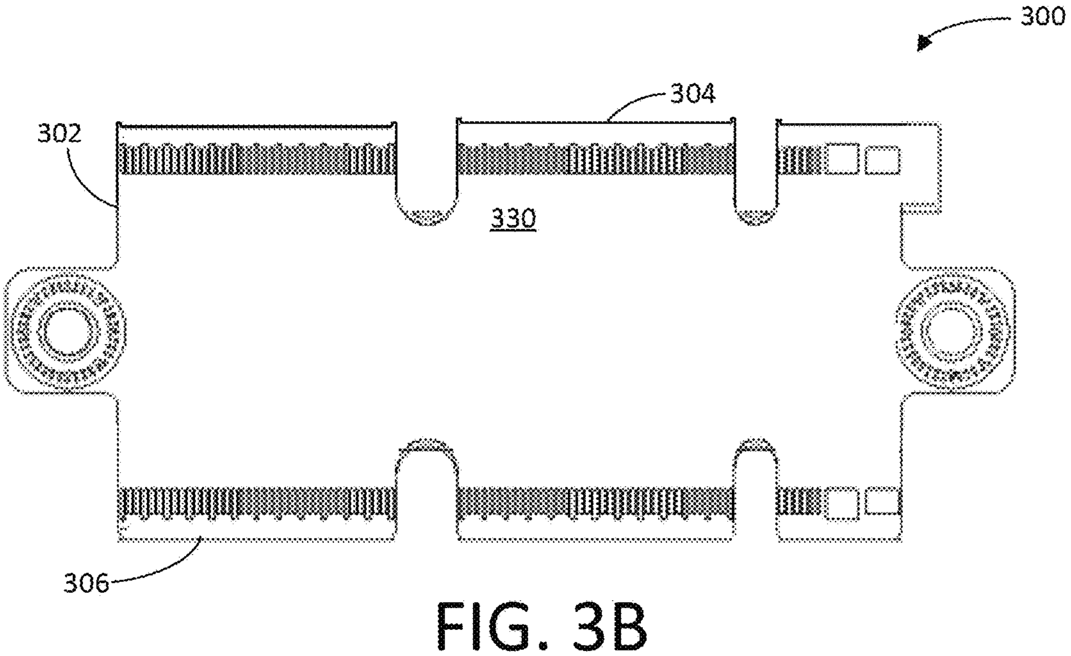
FIG. 3B includes another perspective side view of the other riser card of FIG. 3A according to an example of the present disclosure.
Figure 3C:
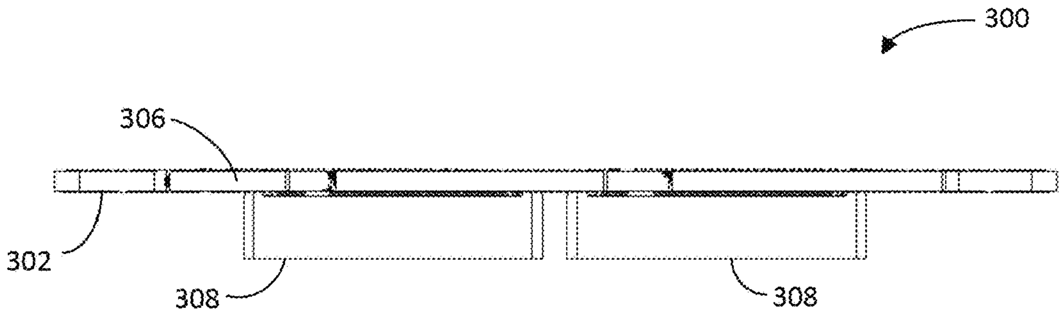
FIG. 3C includes a perspective top view of the other riser card of FIGS. 3A-3B according to an example of the present disclosure.

FIG. 3A depicts a perspective side view of another riser card 300; FIG. 3B depicts another perspective side view of the riser card 300 of FIG. 3A; and FIG. 3C depicts a perspective top view of the riser card 300 of FIG. 3A. The riser card 300 includes a circuit board 302, a plurality of electrical connectors, e.g., a first riser edge connector 304, a second riser edge connector 306, and an array of first riser socket connectors 308, and a pair of mounting holes 311. The riser card 300 is substantially similar to the riser card 200 of FIGS. 2A-2C, except that the riser card 300 is configured or customized by mounting only the array of first riser socket connectors 308 on the circuit board 302 and the circuit board 302 does not include the array of second riser socket connectors 210 as in the riser card 200 of FIGS. 2A-2B.

Figure 4A:
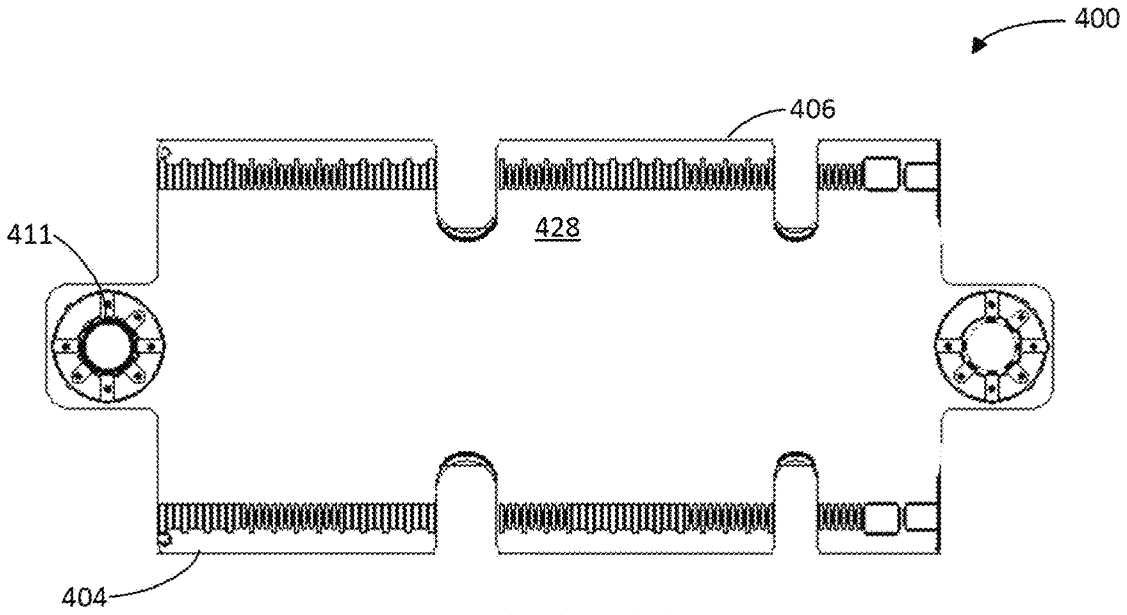
FIG. 4A includes a perspective side view of yet another riser card according to an example of the present disclosure.
Figure 4B:
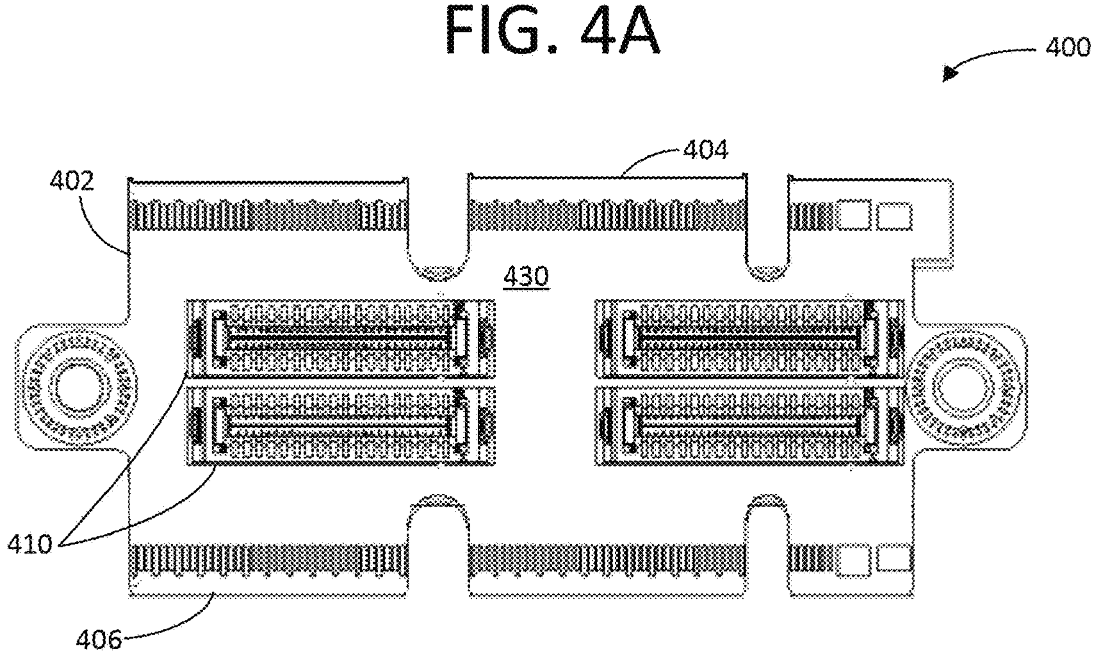
FIG. 4B includes another perspective side view of the other riser card of FIG. 4A according to an example of the present disclosure.
Figure 4C:
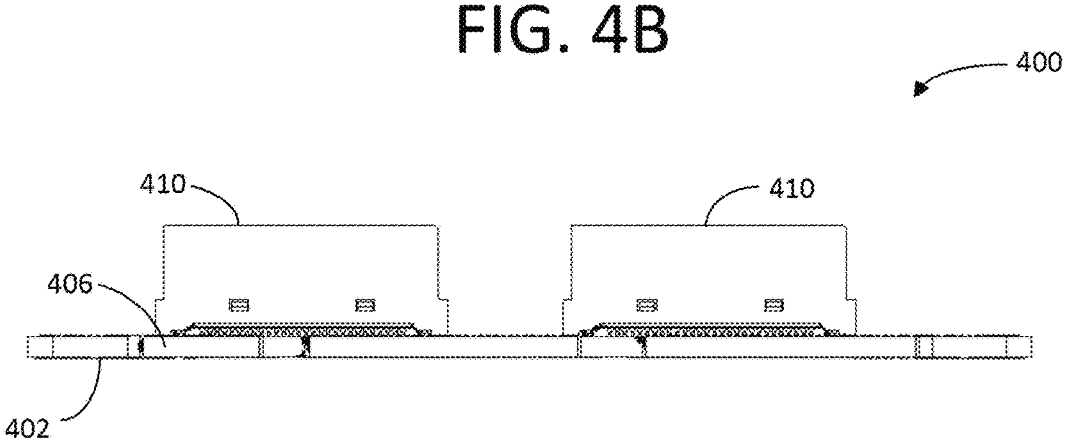
FIG. 4C includes a perspective top view of the other riser card of FIGS. 4A-4B according to an example of the present disclosure.

FIG. 4A depicts a perspective side view of yet another riser card 400; FIG. 4B depicts another perspective side view of the riser card 400 of FIG. 4A; and FIG. 4C depicts a perspective top view of the riser card 400 of FIG. 4A. The riser card 400 includes a circuit board 402, a plurality of electrical connectors, e.g., a first riser edge connector 404, a second riser edge connector 406, and an array of second riser socket connectors 410, and a pair of mounting holes 411. The riser card 400 is substantially similar to the riser card 200 of FIGS. 2A-2C, except that the riser card 400 is configured or customized by mounting only the array of second riser socket connectors 410 on the circuit board 402 and the circuit board 402 does not include the array of first riser socket connectors 208 as in the riser card 200 of FIGS. 2A-2B.

FIG. 5 depicts a perspective view of a first storage drive 500. In some examples, the first storage drive 500 may be an internal storage drive. In some other examples, the first storage drive 500 may be a pluggable storage drive. The first storage drive 500 includes a body 532, a pair of cooling components 534, and a first drive connector 536. The body 532 is sandwiched between the pair of cooling components 534, for example, a pair of heat sinks. The body 532 may include an internal circuitry (not shown) disposed therein and connected to the first drive connector 536. In particular, the first drive connector 536 is disposed at a first end 538 of the first storage drive 500 and the body may have an overhanging region 540 at a second end 542 of the first storage drive 500. The overhanging region 540 may be used to engage with a drive mounting assembly 770 (as shown in FIGS. 7A-7E) to support the first storage drive 500 to the information processing device 700. In some examples, the first storage drive 500 has a complementary second form factor such as an M.2 form factor. Hence, the first drive connector 536 may be referred to as an M.2 plug connector.

FIG. 6 depicts a perspective view of a second storage drive 600. In some examples, the second storage drive 600 may be a pluggable storage drive. In some other examples, the second storage drive 600 may be an internal storage drive. The second storage drive 600 includes a body 632, a pair of cooling components 634, and a second drive connector 636. The body 632 is sandwiched between the pair of cooling components 634, for example, a pair of heat sinks. The body 632 may include an internal circuitry (not shown) disposed therein and connected to the second drive connector 636. In particular, the second drive connector 636 is disposed at a first end 638 of the second storage drive 600 and the body 632 may have a plurality of holes 640 disposed adjacent to the first end 638 and a second end 642 of the second storage drive 600. The plurality of holes 640 may be used to engage with a drive mounting assembly (not shown) to support the second storage drive 600 to the information processing device. In some examples, the second storage drive 600 has a complementary third form factor such as an EDS form factor. Hence, the second drive connector 636 may be referred to as an EDSFF plug connector.

FIG. 7A depicts a perspective view of a portion of an information processing device 700 including a chassis 760, a primary system board 762, a riser card mounting bracket 780. In some examples, the information processing device 700 may be a computer (e.g., a server, a storage device), a networking device (e.g., a switch, an access point), or the like.

The chassis 760 may be an enclosure formed by a pair of peripheral sidewalls (not shown), a base 764, a cover (not shown), a rear panel (not shown), and a front panel (not shown). In such examples, the pair of peripheral sidewalls may be connected to the base 764, the cover, the rear panel, and the front panel to define an internal volume 794 having an internal drive mounting area 796 defined within the internal volume 794 of the chassis 760. The internal drive mounting area 796 includes a drive mounting assembly 770 configured to support the storage drive e.g., a first storage drive 500 (as shown in FIG. 7D) on condition of the first storage drive 500 installed in the internal drive mounting area 796. The drive mounting assembly 770 includes a bracket 772 attached to the primary system board 762 and/or the base 764 and a pair of storage mounts e.g., a pair of M.2 mounts 774 or a pair of EDSFF mounts 874 (as shown in FIG. 8) attached to the bracket 772. In particular, the bracket 772 is attached to the primary system board 762 via a plurality of drive mounting fasteners 776. Each M.2 mount 774 includes a stepped platform region 778A, 778B configured for engaging with the overhanging region 540 (as shown in FIG. 5) of the first storage drive 500 to support the first storage drive 500 in the internal drive mounting area 796. The drive mounting assembly 770 further includes a pair of drive fasteners 788 configured to extend into the pair of M.2 mount 774 to secure the first storage drive 500 to the chassis 760. The process of mounting the first storage drive 500 in the internal drive mounting area 796 is discussed in greater detail below. The chassis 760 may further include a drive cage 798 (as shown in FIG. 7C) coupled to the base 764. The drive cage 798 is discussed in greater detail below.

The primary system board 762 is positioned within the internal volume 794 and mounted on the base 764 via a plurality of support members (not shown). In some examples, the primary system board 762 is a host processor module. In such examples, the host processor module may include a plurality of electronic components as per the OCP guidelines. In some examples, the primary system board 762 may include a substrate and the plurality of essential electronic components, such as a central processing unit, resistors, capacitors, data ports, and power ports, or the like mounted on the substrate. The primary system board 762 further includes a first system board connector 766 and a second system board connector 768 mounted on a face of the primary system board 762. In particular, each of the first and second system board connectors 766, 768 is mounted on the substrate of the primary system board 762 such that each of those connectors extends vertically from the substrate along a second vertical direction 13 parallel to the first axis 10. In such examples, each of the first system board connector 766 and the second system board connector 768 are configured to transfer power, sideband, and data signals. In some examples, each of the first system board connector 766 and the second system board connector 768 is an M-XIO receptacle connector.

The riser card mounting bracket 780 may be used to provide support and secure a riser card 200 to the chassis 760. In some examples, the riser card mounting bracket 780 is attached to the primary system board 762 and/or the base 764 via a plurality of riser mounting fasteners 782. The riser card mounting bracket 780 includes a pair of riser mounts 784 configured to provide support for the riser card 200 and a pair of riser mounting fasteners 786 (as shown in FIG. 7B) configured to secure the riser card 200 to the riser card mounting bracket 780. The riser card mounting bracket 780 may include an opening 785 to allow the riser socket connector e.g., a second riser socket connector 210 to protrude beyond riser card mounting bracket 780 to allow mating of the second riser socket connector 210 with the storage drive e.g., the second storage drive 600.

FIG. 7B depicts a perspective view of the portion of the information processing device 700 of FIG. 7A further having the riser card 200 of FIGS. 2A-2C disposed in a first mounting orientation. In some examples, the riser card 200 is installed in the first mounting orientation such that: the first face 228 of a circuit board 202 of the riser card 200 faces the internal drive mounting area 796, the second face 230 of the circuit board 202 faces the drive cage 798 (as shown in FIG. 7C), the first riser edge connector 204 is detachably mated with the first system board connector 766, and the pair of mounting holes 211 in the riser card 200 is aligned with the pair of riser mounts 784. In such examples, the pair of riser mounting fasteners 786 extends into the pair of riser mounts 784 via the pair of mounting holes 211 so as to secure the riser card 200 to the riser card mounting bracket 780 while the first riser edge connector 204 is mated with the first system board connector 766. In some examples, the first riser edge connector 204 of the riser card 200 receives power, sideband, and data signals from the first system board connector 766. The first riser edge connector 204 further transfers the power, sideband, and data signals to the first riser socket connector 208 via internal circuitry (not shown) of the circuit board 202.

FIG. 7C depicts a perspective view of the portion of the information processing device 700 of FIG. 7B further including a drive cage 798. In some examples, the drive cage 798 is an enclosure disposed adjacent to the riser card mounting bracket 780 and coupled to the base 764. In particular, a first end 798A of the drive cage 798 is coupled to the base 764 and a second end 798B opposite to the first end 798A is configured to receive the second storage drive 600 so as to removably install the second storage drive 600 in the primary system board 762 via the riser card 200. The first end 798A has an opening (not shown) to allow the second drive connector 636 to extend out of the drive cage 798 to detachably mate with the second riser socket connector 210. Similarly, the second end 798B has another opening (not shown) to allow the second drive connector 636 to be removably inserted into the drive cage 798. In some examples, in the first mounting orientation of the riser card 200 in the primary system board 762 a second face 230 of the circuit board 202 faces the first end 798A of the drive cage 798.

FIG. 7D depicts a perspective view of the portion of the information processing device 700 of FIG. 7C further having an array of first storage drives 500 of FIG. 5. In some examples, the array of first storage drives 500 is disposed in an internal drive mounting area 796 of the information processing device 700 such that the first drive connector 536 of each first storage drives 500 is mated with a corresponding first riser socket connector 208 of the riser card 200. Further, each first riser socket connector 208 is secured to the information processing device 700 using the drive mounting assembly 770. In some examples, a drive mounting assembly 770 is configured to support the first storage drive 500 on condition of the first storage drive 500 installed in the internal drive mounting area 796. In particular, when each first storage drive 500 is disposed in the internal drive mounting area 796, an overhanging region 540 of the corresponding first drive connector 536 seats on one of a stepped platform region 778A, 778B of one M.2 mount of the pair of M.2 mounts 774. Further each fastener among the pair of drive fasteners 788 extends into a corresponding M.2. mount among the pair of M.2 mounts 774 to secure at least one pair of first storage drives 500 seated on the M.2 mount to the chassis 760. In such examples, the first riser socket connector 208 transfers the received power, sideband, and data signals to each of the first storage drive 500. In other words, the first storage drive 500 is installed in the internal drive mounting area 796 such that the first drive connector 536 is detachably mated with the first riser socket connector 208 so as to allow the first storage drive 500 to receive power, sideband, and data signals from the primary system board 762 via the first system board connector 766, the first riser edge connector 204, the first riser socket connector 208, and the first drive connector 536.

FIG. 7E depicts a perspective view of the portion of the information processing device 700 of FIG. 7D further having an array of second storage drives 600 of FIG. 6 disposed in a drive cage 798 (as shown in FIGS. 7C-7D). In the example of FIG. 7E, the drive cage 798 is not shown for ease of illustration of the array of second storage drives 600 and such non-illustration of the drive cage 798 should not be construed as a limitation of the present disclosure. In some examples, the array of second storage drives 600 is removably disposed in the drive cage 798 via the other opening formed in the second end 798B of the drive cage 798. In such examples, when each second storage drive 600 is removably disposed in the drive cage 798, the second drive connector 636 extends out of the drive cage 798 via the opening at the first end 798A to detachably mate with the second riser socket connector 210. In such examples, the information processing device 700 further includes a cable 750 configured to electrically connect the second riser edge connector 206 to the second system board connector 768. In some examples, the cable 750 includes a first cable connector 752 and a second cable connector 754. In such examples, the first cable connector 752 is mated with the second system board connector 768 of the primary system board 762 and the second cable connector 754 is mated with the second riser edge connector 206. In some examples, each of the first and second cable connectors 752, 754 has a M-XIO form factor. Hence, the cable 750 includes an M-XIO plug connector and an M-XIO receptacle connector. In particular, the first cable connector 752 is the M-XIO plug connector and the second cable connector 754 is the M-XIO receptacle connector. In one or more examples, the second riser edge connector 206 receives power, sideband, and data signals from the second system board connector 768. The second riser edge connector 206 further transfers the power, sideband, and data signals to the second riser socket connector 210 via internal circuitry (not shown) of the circuit board 202. In such examples, the second riser socket connector 210 further transfers the received power, sideband, and data signals to each of the second storage drive 600. In other words, the second storage drive 600 is installed in the drive cage 798 such that the second drive connector 636 is detachably mated with the second riser socket connector 210 so as to allow the second storage drive 600 to receive the power, sideband, and data signals from the primary system board 762 via the second system board connector 768, the cable 750, the second riser edge connector 206, the second riser socket connector 210, and the second drive connector 636.

In the examples of FIGS. 7D-7E, the riser card 200 includes the array of first riser socket connectors, including the first riser socket connector 208, mounted to the first face 228 of the circuit board 202, and the array of second riser socket connectors, including the second riser socket connector 210, mounted to the second face 230 of the circuit board 202. In such examples, the internal drive mounting area 796 is configured to receive a plurality of first storage drives, including the first storage drive 500, mated with the array of first riser socket connectors. Further, the drive cage 798 is configured to receive a plurality of second storage drives, including the second storage drive 600, detachably mated with the array of second riser socket connectors. In such examples, the first storage drives 500 includes M.2 storage drives, the internal drive mounting area 796 includes the drive mounting assembly 770 including the bracket 772 attached to the primary system board 762 and/or the base 764 and a plurality of M.2 mounts 774 attached to the bracket 772 and configured to engage with and support the first storage drives 500 on condition of the first storage drives 500 installed in the internal drive mounting area 796.

In some examples, the riser card 200 may be configured to be reinstallable in the first system board connector 766 in a second mounting orientation in which: the first face 228 of the circuit board 205 faces the drive cage 798, and the second face 230 of the circuit board 202 faces the internal drive mounting area 796, and the second riser edge connector 206 is detachably mated with the first system board connector 766.

FIG. 8 depicts a perspective view of a portion of an information processing device 800 having a riser card 200 disposed in a second mounting orientation. In some examples, the riser card 200 is installed in the second mounting orientation such that: the second face 230 of a circuit board 202 of the riser card 200 faces the internal drive mounting area 896, the first face 228 of the circuit board 202 faces the drive cage (not shown), the second riser edge connector 206 is detachably mated with the first system board connector 866.

In such examples, an array of second storage drives 600 is removably disposed in the internal drive mounting area 896 such that the second drive connector 636 of each second storage drive 600 is mated with a corresponding second riser socket connector 210 of the riser card 200. Further, each second riser socket connector 210 is secured to the information processing device 800 using a riser card mounting bracket 880, which is similar to the riser card mounting bracket 780 discussed hereinabove. Similarly, each second storage drive 600 is secured to a drive mounting assembly 870, which is similar to the drive mounting assembly 770 discussed hereinabove.

Each second storage drive 600 is installed in the internal drive mounting area 896 such that the second drive connector 636 is mated with the second riser socket connector 210 so as to allow the second storage drive 600 to receive power, sideband, and data signals from the primary system board 862 via a first system board connector 866, the second riser edge connector 206, the second riser socket connector 210, and the second drive connector 636.

Figure 9:
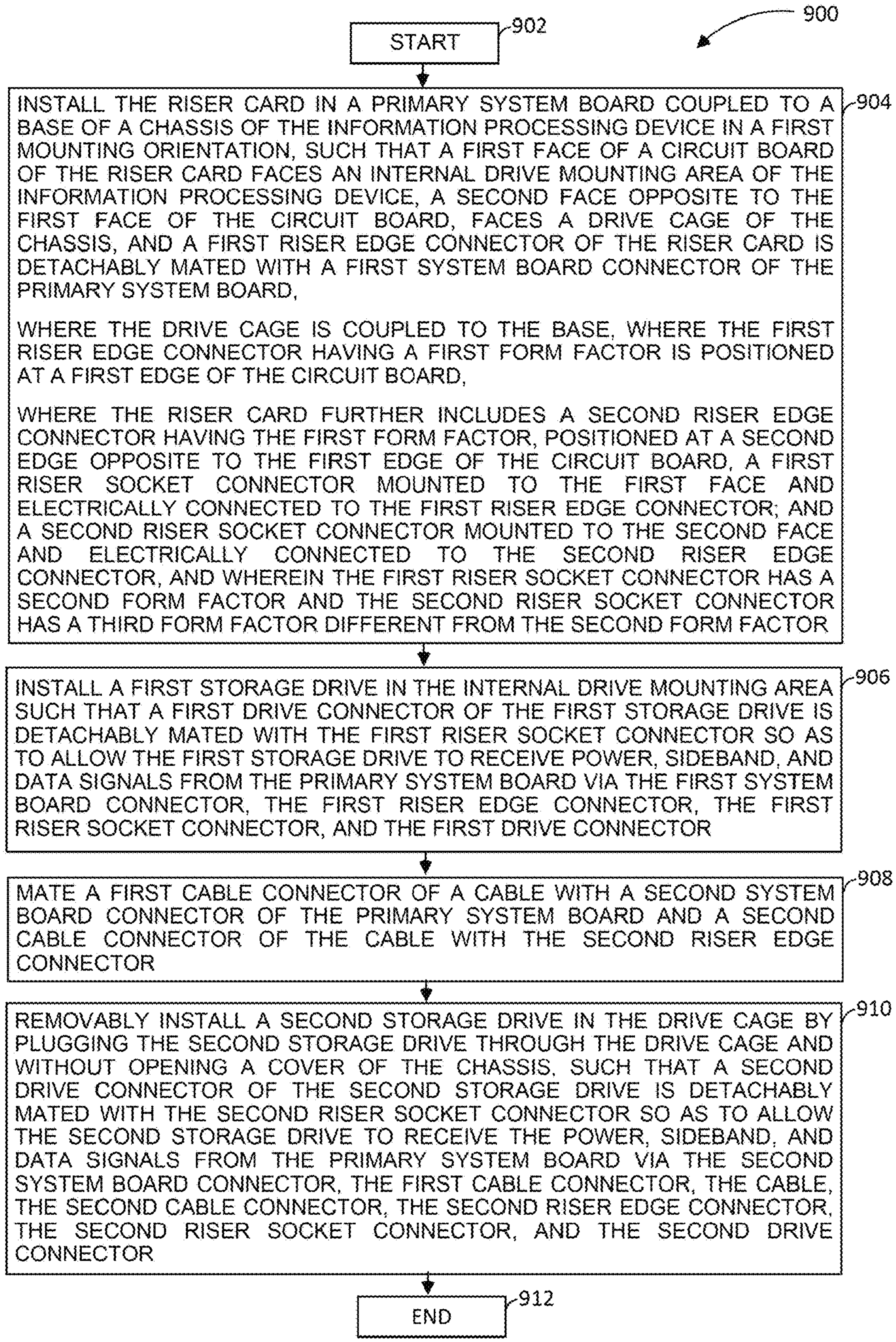
FIG. 9 is a flowchart depicting a method of installing a riser card and a plurality of storage drives in an information processing device according to one example of the present disclosure.

FIG. 9 depicts a flowchart showing a method 900 of installing a riser card and a plurality of storage drives in an information processing device. It may be noted herein that the method 900 is described in conjunction with FIGS.

2A-2C and 7A-7E for example. The method 900 starts at block 902 and continues to block 904.

At block 904, the method 900 includes installing the riser card in a primary system board coupled to a base of a chassis of the information processing device in a first mounting orientation, such that a first face of a circuit board of the riser card faces an internal drive mounting area of the information processing device, a second face opposite to the first face of the circuit board, faces a drive cage of the chassis, and a first riser edge connector of the riser card is detachably mated with a first system board connector of the primary system board. In some examples, the drive cage is coupled to the base and the first riser edge connector having a first form factor is positioned at a first edge of the circuit board. Further, the riser card includes a second riser edge connector having the first form factor, positioned at a second edge opposite to the first edge of the circuit board, a first riser socket connector mounted to the first face and electrically connected to the first riser edge connector; and a second riser socket connector mounted to the second face and electrically connected to the second riser edge connector, and wherein the first riser socket connector has a second form factor and the second riser socket connector has a third form factor different from the second form factor. The method 900 continues to block 906.

At block 906, the method 900 includes installing a first storage drive in the internal drive mounting area such that a first drive connector of the first storage drive is detachably mated with the first riser socket connector so as to allow the first storage drive to receive power, sideband, and data signals from the primary system board via the first system board connector, the first riser edge connector, the first riser socket connector, and the first drive connector. The method 900 continues to block 908.

At block 908, the method 900 further includes mating a first cable connector of a cable with a second system board connector of the primary system board and a second cable connector of the cable with the second riser edge connector. The method 900 continues to block 910.

At block 910, the method 900 further includes removably installing a second storage drive in the drive cage by plugging the second storage drive through the drive cage and without opening a cover of the chassis, such that a second drive connector of the second storage drive is detachably mated with the second riser socket connector so as to allow the second storage drive to receive the power, sideband, and data signals from the primary system board via the second system board connector, the first cable connector, the cable, the second cable connector, the second riser edge connector, the second riser socket connector, and the second drive connector.

In some examples, the method 900 further includes reinstalling the riser card in the primary system board in a second mounting orientation, such that the second riser edge connector is detachably mated with the first system board connector. In the second mounting orientation: the method includes installing the first storage drive in the drive mounting area such that the first drive connector is detachably mated with the second riser socket connector so as to allow the first storage drive to receive the power, sideband, and data signals from the primary system board via the first system board connector, the second riser edge connector, the second riser socket connector, and the first drive connector. The method further includes installing the second storage drive in the drive mounting area such that the second drive connector is detachably mated with the second riser socket connector so as to allow the second storage drive to receive the power, sideband, and data signals from the primary system board via the first system board connector, the second riser edge connector, the second riser socket connector, and the second drive connector. The method 900 ends at block 912.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A riser card comprising:
- a circuit board;
- a first riser edge connector having a first form factor and positioned at a first edge of the circuit board;
- a second riser edge connector having the first form factor and positioned at a second edge opposite to the first edge of the circuit board;
- a first riser socket connector mounted to a first face of the circuit board and electrically connected to the first riser edge connector, and configured to mate with a first drive connector of a first storage drive; and
- a second riser socket connector mounted to a second face opposite to the first face of the circuit board and electrically connected to the second riser edge connector and configured to detachably mate with a second drive connector of a second storage drive,
- wherein the first riser socket connector has a second form factor, and the second riser socket connector has a third form factor different from the second form factor.

2. The riser card of claim 1, wherein the first form factor is a modular extensible input output (M-XIO) form factor.

3. The riser card of claim 1, wherein the first riser edge connector and the second riser edge connector both have power, sideband, and communication pins, and equal number and arrangement of the power, sideband, and communication pins.

4. The riser card of claim 1, wherein the second form factor is an M.2 form factor, and the third form factor is an enterprise and datacenter standard (EDS) form factor.

5. The riser card of claim 4, wherein the second form factor comprises an M.2 receptacle connector form factor and the third form factor comprises an EDS receptacle connector form factor.

6. The riser card of claim 1, comprising an array of first riser socket connectors mounted to the first face of the circuit board, and an array of second riser socket connectors mounted to the second face of the circuit board.

7. An information processing device comprising:
- a chassis comprising a base, and a drive cage coupled to the base;
- a primary system board coupled to the base, and comprising a first system board connector and a second system board connector;
- an internal drive mounting area configured to receive a first storage drive, wherein the drive cage is configured to removably receive a second storage drive; and
- a riser card installed in the first system board connector, comprising:
  - a circuit board comprising a first edge, a second edge opposite to the first edge, a first face, and a second face opposite the first face;
  - a first riser edge connector having a first form factor and positioned at the first edge;

a second riser edge connector having the first form factor and positioned at the second edge;

a first riser socket connector mounted to the first face, electrically connected to the first riser edge connector, having a second form factor, and configured to mate with a first drive connector of the first storage drive; and a second riser socket connector mounted to the second face, electrically connected to the second riser edge connector, and having a third form factor different from the second form factor, and configured to detachably mate with a second drive connector of the second storage drive, wherein the riser card is installed in a first mounting orientation such that: the first face of the circuit board faces the internal drive mounting area, the second face of the circuit board faces the drive cage, the first riser edge connector is detachably mated with the first system board connector, and a cable electrically connects the second riser edge connector to the second system board connector.

8. The information processing device of claim 7, wherein the internal drive mounting area comprises a drive mounting assembly configured to support the first storage drive on condition of the first storage drive installed in the internal drive mounting area.

9. The information processing device of claim 8, wherein the first storage drive comprises an M.2 storage drive and the drive mounting assembly comprises a bracket attached to the primary system board and/or the base and an M.2 mount attached to the bracket.

10. The information processing device of claim 7, further comprising a riser card mounting bracket attached to the primary system board and/or the base and coupled to the riser card to support and secure the riser card in the first system board connector.

11. The information processing device of claim 7, further comprising the first storage drive installed in the internal drive mounting area such that the first drive connector is detachably mated with the first riser socket connector so as to allow the first storage drive to receive power, sideband, and data signals from the primary system board via the first system board connector, the first riser edge connector, the first riser socket connector, and the first drive connector.

12. The information processing device of claim 11, further comprising the second storage drive installed in the drive cage such that the second drive connector is detachably mated with the second riser socket connector so as to allow the second storage drive to receive the power, sideband, and data signals from the primary system board via the second system board connector, a cable, the second riser edge connector, the second riser socket connector, and the second drive connector.

13. The information processing device of claim 12, wherein: each of the first and second riser edge connectors is a modular extensible input output (M-XIO) plug connector, the first riser socket connector is an M.2 receptacle connector, the second riser socket connector is an EDSFF receptacle connector, the first drive connector is an M.2 plug connector, the second drive connector is an EDSFF plug connector, each of the first and second system board connectors is an M-XIO receptacle connector, and the cable comprises an M-XIO plug connector and an M-XIO receptacle connector.

14. The information processing device of claim 7, wherein the riser card is configured to be reinstallable in the first system board connector in a second mounting orientation in which: the first face of the circuit board faces the drive cage, and the second face of the circuit board faces the internal drive mounting area, and the second riser edge connector is detachably mated with the first system board connector.

15. The information processing device of claim 7, wherein the first form factor is a modular extensible input output (M-XIO) form factor, and wherein the first riser edge connector and the second riser edge connector both have power, sideband, and communication pins, and equal number and arrangement of the power, sideband, and communication pins.

16. The information processing device of claim 7, wherein the second form factor is an M.2 form factor, and the third form factor is an enterprise and datacenter standard (EDS) form factor.

17. The information processing device of claim 7, wherein the riser card comprises an array of first riser socket connectors, including the first riser socket connector, mounted to the first face of the circuit board, and an array of second riser socket connectors, including the second riser socket connector, mounted to the second face of the circuit board, wherein the internal drive mounting area is configured to receive a plurality of first storage drives, including the first storage drive, mated with the array of first riser socket connectors, and wherein the drive cage is configured to receive a plurality of second storage drives, including the second storage drive, detachably mated with the array of second riser socket connectors.

18. The information processing device of claim 17, wherein the first storage drives comprise M.2 storage drives, wherein the internal drive mounting area comprises a drive mounting assembly comprising a bracket attached to the primary system board and/or the base and a plurality of M.2 mounts attached to the bracket and configured to engage with and support the first storage drives on condition of the first storage drives installed in the internal drive mounting area.

19. A method of installing a riser card and a plurality of storage drives in an information processing device, comprising:

installing the riser card in a primary system board coupled to a base of a chassis of the information processing device in a first mounting orientation, such that a first face of a circuit board of the riser card faces an internal drive mounting area of the information processing device, a second face opposite to the first face of the circuit board, faces a drive cage of the chassis, and a first riser edge connector of the riser card is detachably mated with a first system board connector of the primary system board, wherein the drive cage is coupled to the base, wherein the first riser edge connector having a first form factor is positioned at a first edge of the circuit board, wherein the riser card further comprises a second riser edge connector having the first form factor, positioned at a second edge opposite to the first edge of the circuit board, a first riser socket connector mounted to the first face and electrically connected to the first riser edge connector; and a second riser socket connector mounted to the second face and electrically connected to the second riser edge connector, and wherein the first riser socket connector has a second form factor and the second riser socket connector has a third form factor different from the second form factor;

installing a first storage drive in the internal drive mounting area such that a first drive connector of the first storage drive is detachably mated with the first riser socket connector so as to allow the first storage drive to receive power, sideband, and data signals from the primary system board via the first system board connector, the first riser edge connector, the first riser socket connector, and the first drive connector;

mating a first cable connector of a cable with a second system board connector of the primary system board and a second cable connector of the cable with the second riser edge connector; and removably installing a second storage drive in the drive cage by plugging the second storage drive through the drive cage and without opening a cover of the chassis, such that a second drive connector of the second storage drive is detachably mated with the second riser socket connector so as to allow the second storage drive to receive the power, sideband, and data signals from the primary system board via the second system board connector, the first cable connector, the cable, the second cable connector, the second riser edge connector, the second riser socket connector, and the second drive connector.

20. The method of claim 19, further comprising reinstalling the riser card in the primary system board in a second mounting orientation, such that the second riser edge connector is detachably mated with the first system board connector, wherein in the second mounting orientation:

installing the first storage drive in the drive mounting area such that the first drive connector is detachably mated with the second riser socket connector so as to allow the first storage drive to receive the power, sideband, and data signals from the primary system board via the first system board connector, the second riser edge connector, the second riser socket connector, and the first drive connector; and installing the second storage drive in the drive mounting area such that the second drive connector is detachably mated with the second riser socket connector so as to allow the second storage drive to receive the power, sideband, and data signals from the primary system board via the first system board connector, the second riser edge connector, the second riser socket connector, and the second drive connector.

* * * * *